United States Patent
Lin et al.

(10) Patent No.: US 9,281,259 B2
(45) Date of Patent: Mar. 8, 2016

(54) SEMICONDUCTOR DEVICE AND METHOD OF FORMING THICK ENCAPSULANT FOR STIFFNESS WITH RECESSES FOR STRESS RELIEF IN FO-WLCSP

(71) Applicant: STATS ChipPAC, Ltd., Singapore (SG)

(72) Inventors: Yaojian Lin, Singapore (SG); Kang Chen, Singapore (SG); Jose Alvin Caparas, Singapore (SG); Glenn Omandam, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 4 days.

(21) Appl. No.: 14/079,273

(22) Filed: Nov. 13, 2013

(65) Prior Publication Data
US 2014/0061944 A1    Mar. 6, 2014

Related U.S. Application Data

(63) Continuation of application No. 13/315,010, filed on Dec. 8, 2011, now Pat. No. 8,610,286.

(51) Int. Cl.
| | |
|---|---|
| *H01L 23/48* | (2006.01) |
| *H01L 23/52* | (2006.01) |
| *H01L 29/40* | (2006.01) |
| *H01L 23/31* | (2006.01) |
| *H01L 23/00* | (2006.01) |
| *H01L 21/56* | (2006.01) |

(52) U.S. Cl.
CPC ............ *H01L 23/315* (2013.01); *H01L 21/563* (2013.01); *H01L 21/568* (2013.01); *H01L 23/3114* (2013.01); *H01L 23/3128* (2013.01); *H01L 23/3135* (2013.01); *H01L 24/19* (2013.01); *H01L 24/20* (2013.01); *H01L 24/96* (2013.01); *H01L 21/561* (2013.01); *H01L 2224/0401* (2013.01); *H01L 2224/04105* (2013.01); *H01L 2224/12105* (2013.01); *H01L 2224/73265* (2013.01);

(Continued)

(58) Field of Classification Search
USPC ................ 257/100, 433, 434, 667, 787–796, 257/E31.117–E21.118, E51.02, 257/E21.502–E21.504, 678–733, 257/E23.001–E23.194, E21.449–E21.519, 257/620; 438/15, 25, 26, 51, 55, 64–67, 438/112, 124, 126, 127, 63, 113, 114, 458, 438/460–465
See application file for complete search history.

(56) References Cited

U.S. PATENT DOCUMENTS

| | | | |
|---|---|---|---|
| 7,687,895 B2 * | 3/2010 | Brunnbauer | H01L 21/561 257/685 |
| 8,021,930 B2 | 9/2011 | Pagaila | |

(Continued)

*Primary Examiner* — Dao H Nguyen
*Assistant Examiner* — Tram H Nguyen
(74) *Attorney, Agent, or Firm* — Robert D. Atkins; Patent Law Group: Atkins and Associates, P.C.

(57) ABSTRACT

A semiconductor device has a semiconductor die mounted to a carrier. A first encapsulant is deposited over the semiconductor die and carrier. A stiffening support member can be disposed over the carrier around the semiconductor die. A plurality of channels or recesses is formed in the first encapsulant. The recesses can be formed by removing a portion of the first encapsulant. Alternatively, the recesses are formed in a chase mold having a plurality of extended surfaces. A second encapsulant can be deposited into the recesses of the first encapsulant. The carrier is removed and an interconnect structure is formed over the semiconductor die and first encapsulant. The thickness of the first encapsulant provides sufficient stiffness to reduce warpage while the recesses provide stress relief during formation of the interconnect structure. A portion of the first encapsulant and recesses are removed to reduce thickness of the semiconductor device.

24 Claims, 32 Drawing Sheets

(52) U.S. Cl.
CPC ............... *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/1815* (2013.01); *H01L 2924/351* (2013.01)

(56) References Cited

U.S. PATENT DOCUMENTS

| | | | |
|---|---|---|---|
| 2002/0066952 A1* | 6/2002 | Taniguchi | H01L 23/3128 257/698 |
| 2002/0096789 A1* | 7/2002 | Bolken | 257/787 |
| 2004/0124515 A1 | 7/2004 | Tao et al. | |
| 2006/0017127 A1 | 1/2006 | Vigier-Blanc | |
| 2006/0057773 A1* | 3/2006 | Gross | H01L 23/3107 438/107 |
| 2008/0003718 A1 | 1/2008 | Estepa et al. | |
| 2008/0153208 A1 | 6/2008 | Matsunami | |
| 2008/0315385 A1* | 12/2008 | Gerber | H01L 21/561 257/686 |
| 2010/0019338 A1* | 1/2010 | Kwon | H01L 21/561 257/433 |
| 2010/0072599 A1* | 3/2010 | Camacho | H01L 21/6835 257/686 |
| 2011/0006408 A1* | 1/2011 | Liao | 257/660 |
| 2012/0139120 A1* | 6/2012 | Chow et al. | 257/773 |
| 2012/0273957 A1* | 11/2012 | Meyer | H01L 21/486 257/773 |

\* cited by examiner

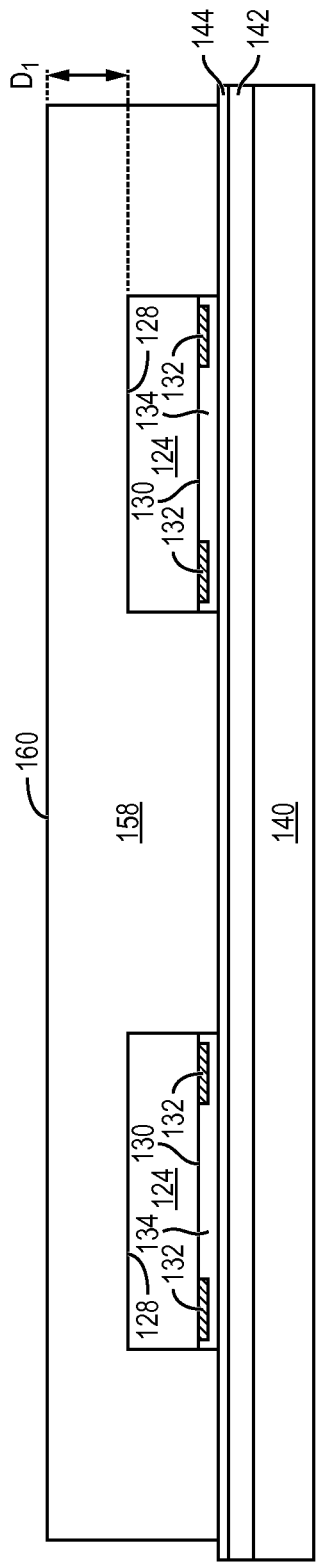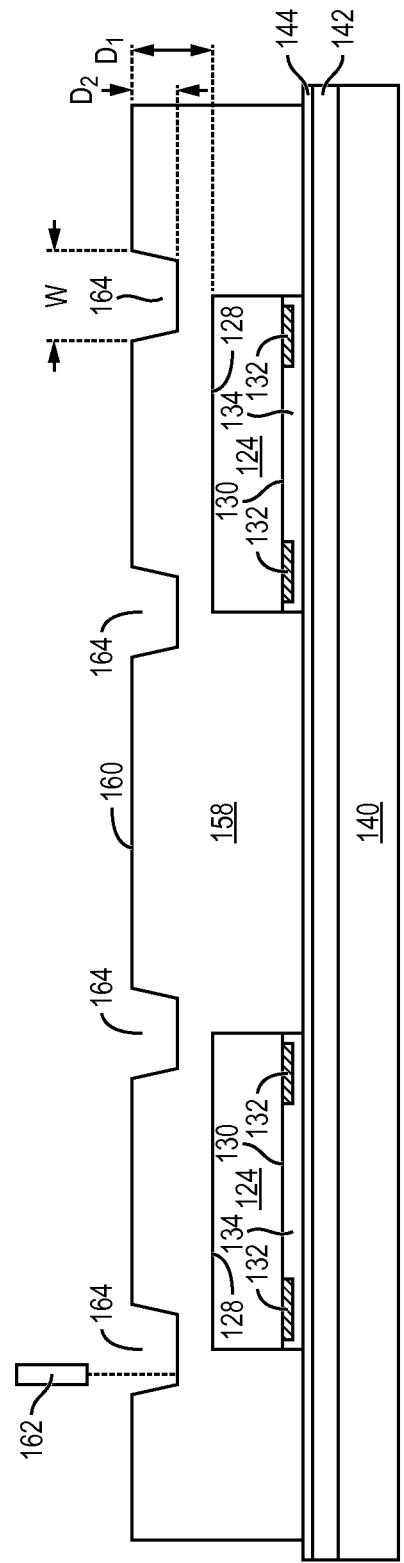

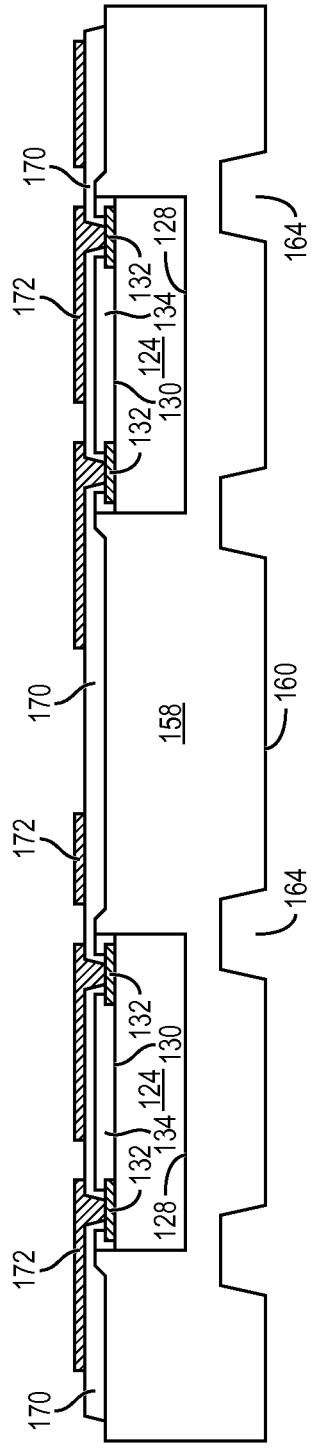
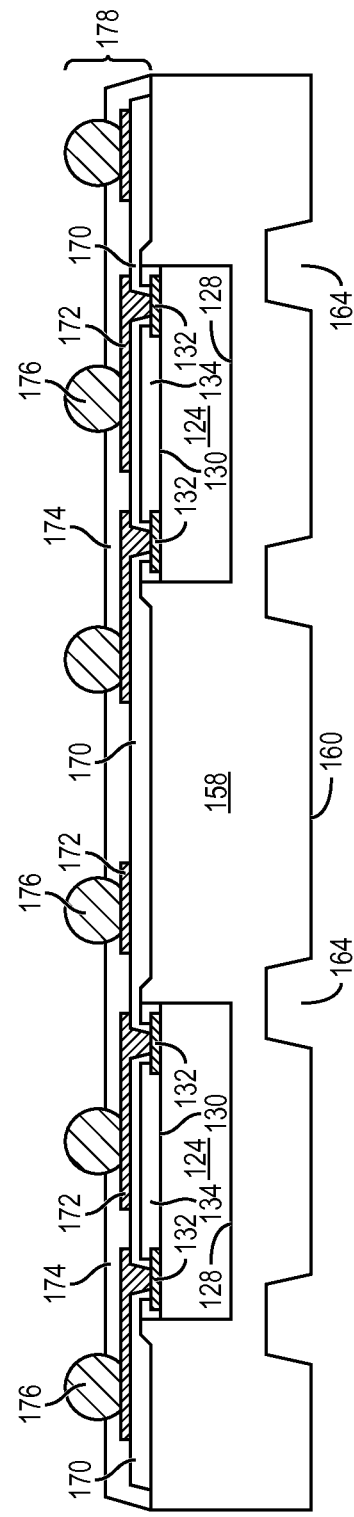

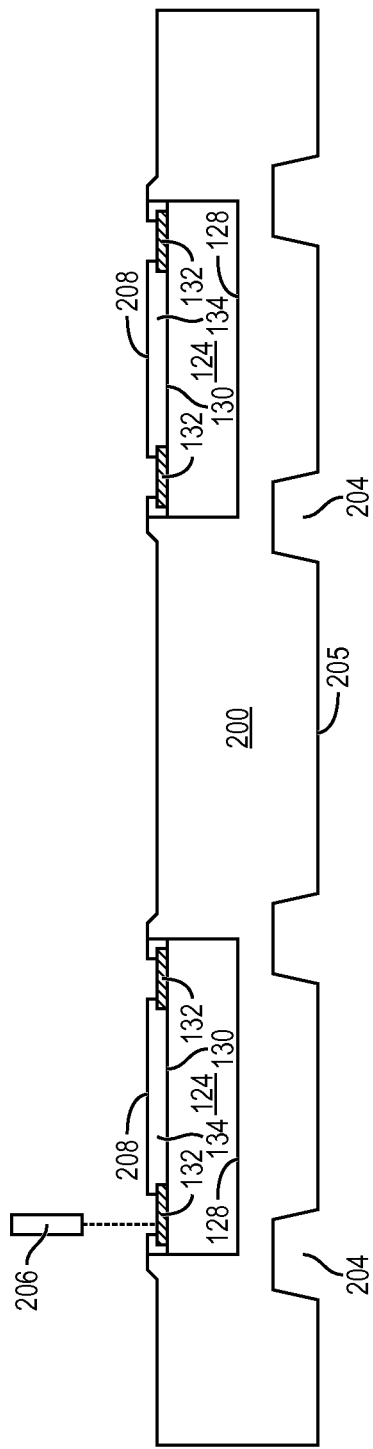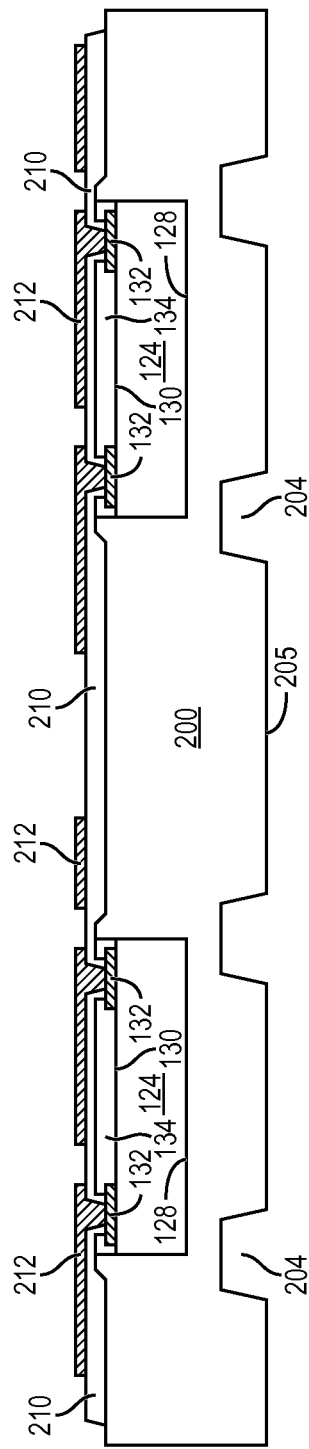

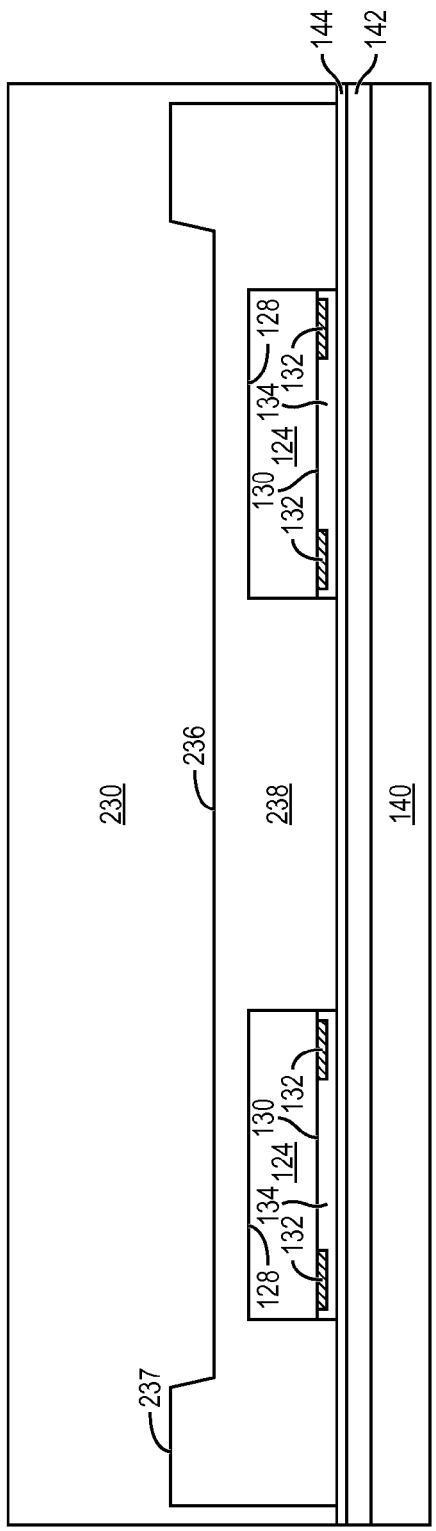
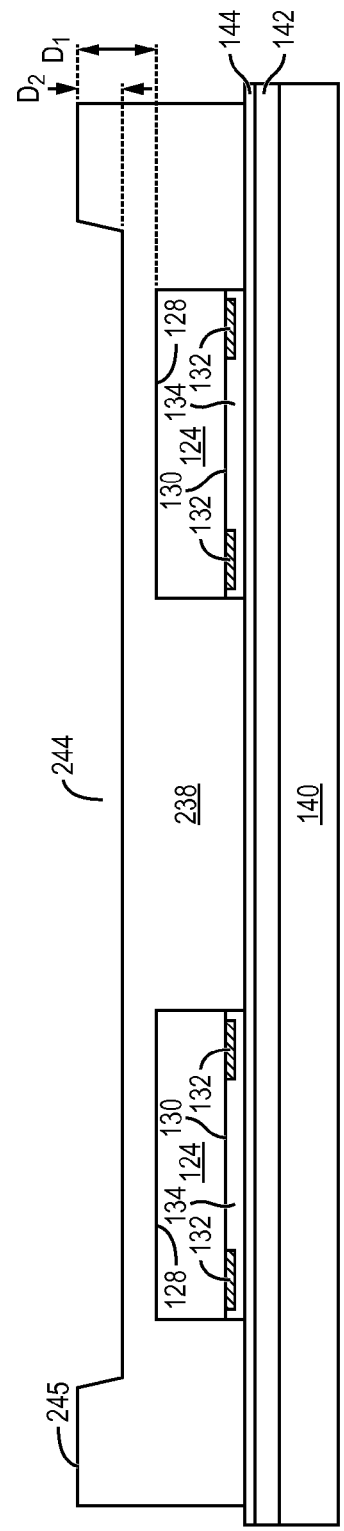
FIG. 8a
FIG. 8b

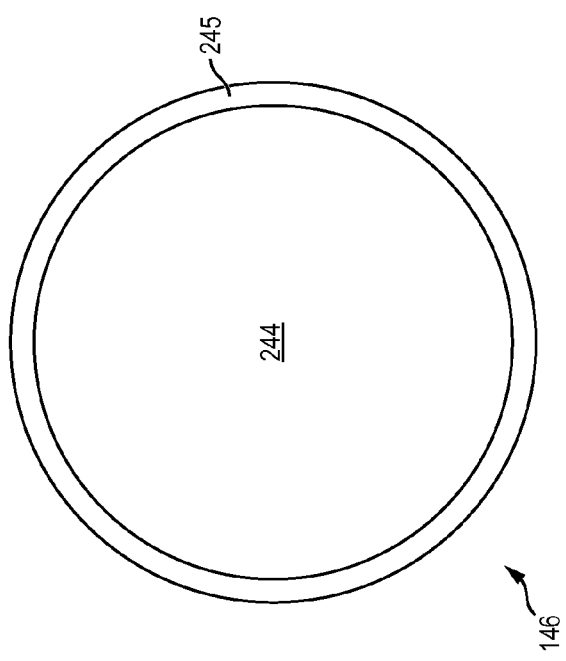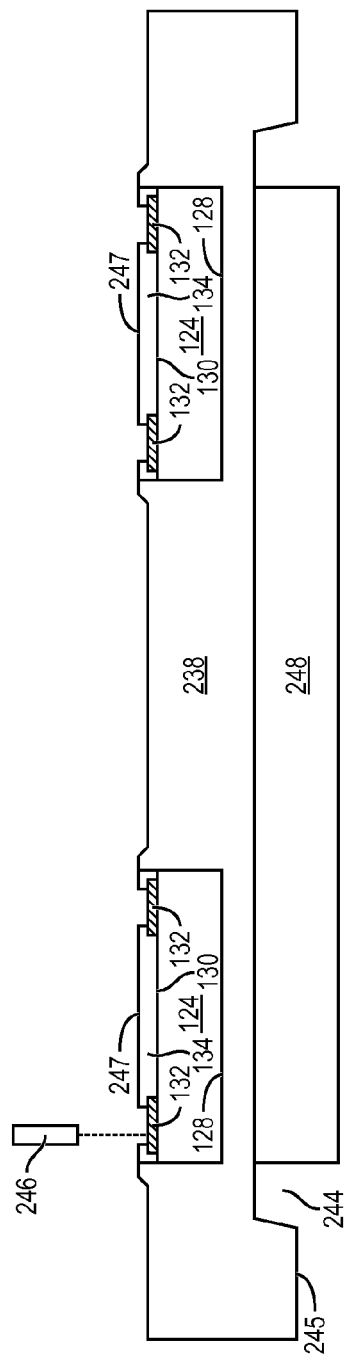

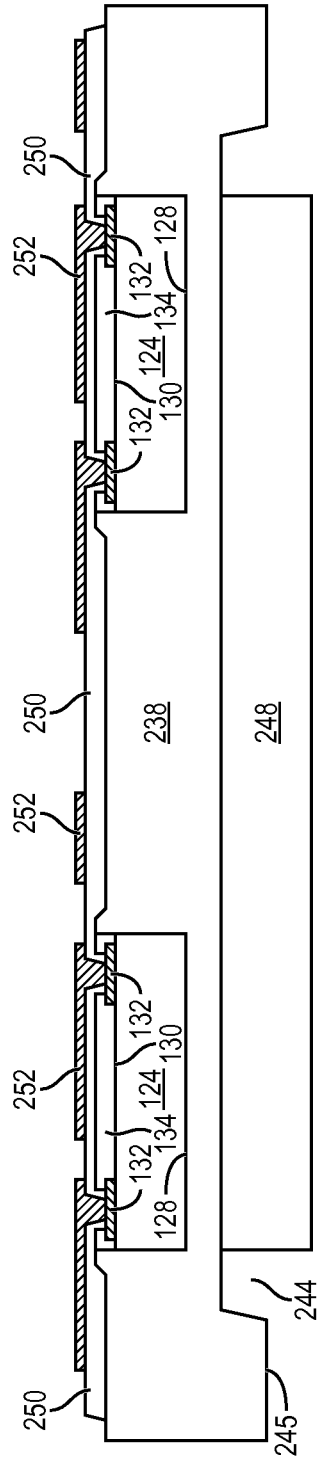
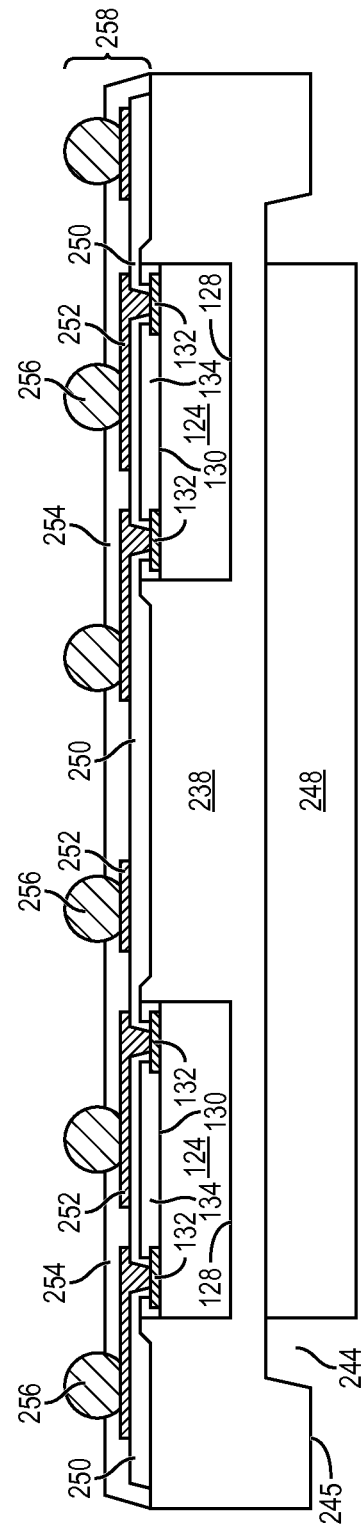

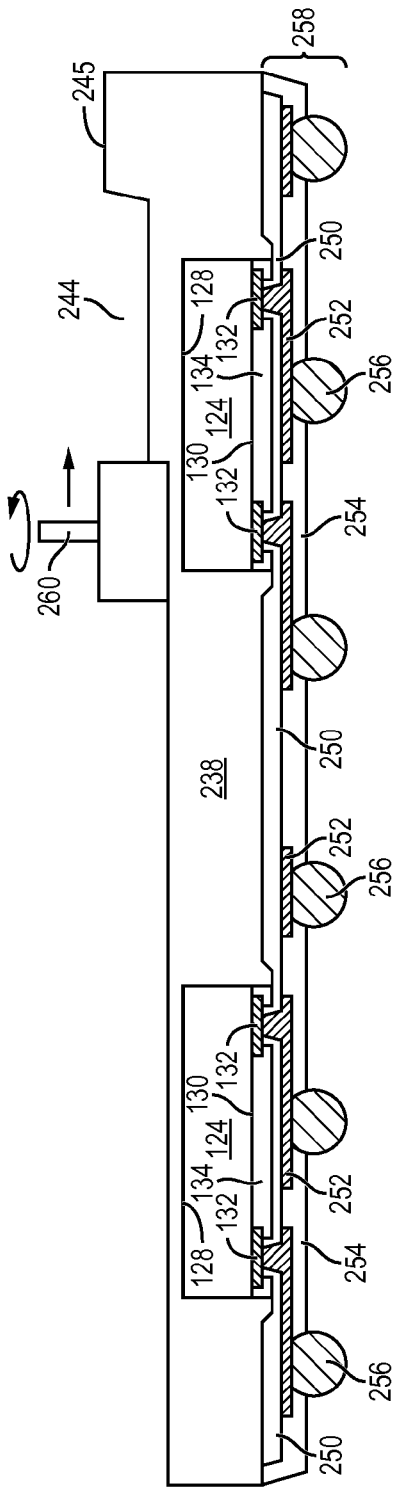
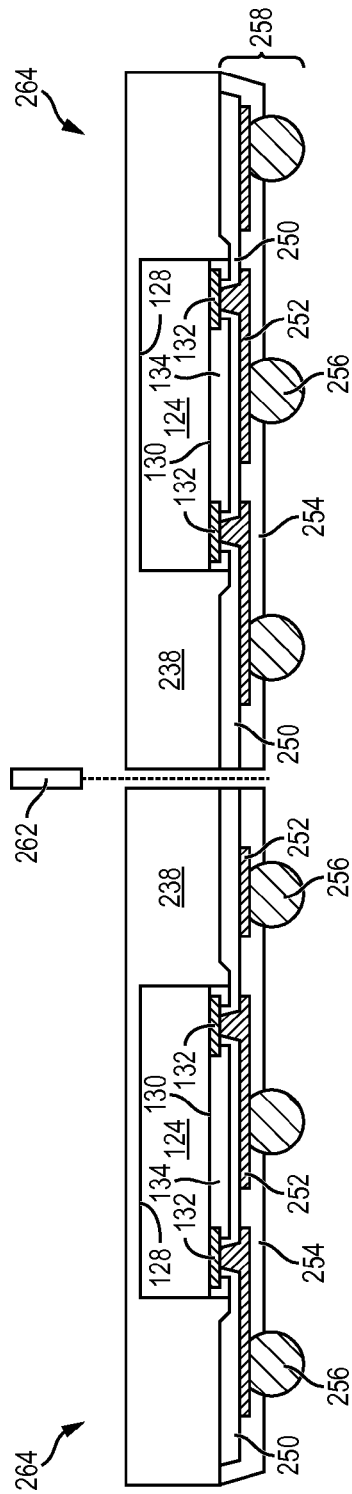
FIG. 8g
FIG. 8h

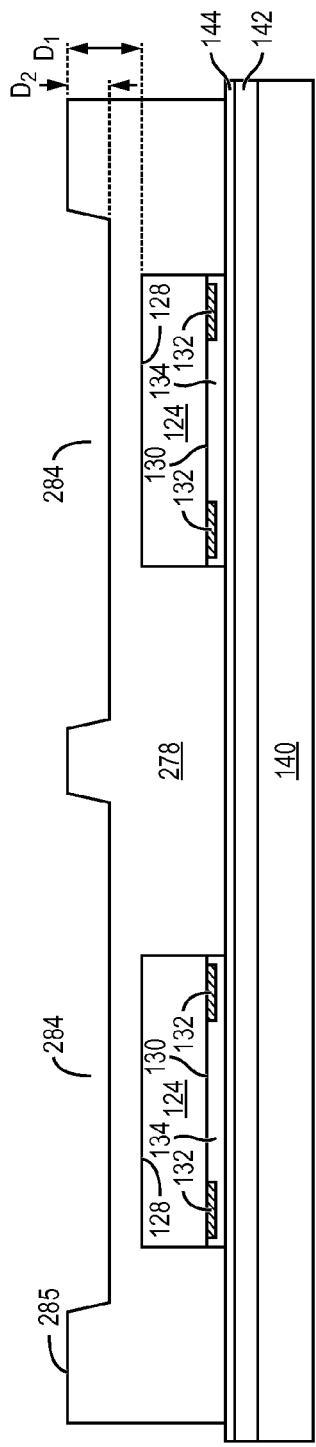
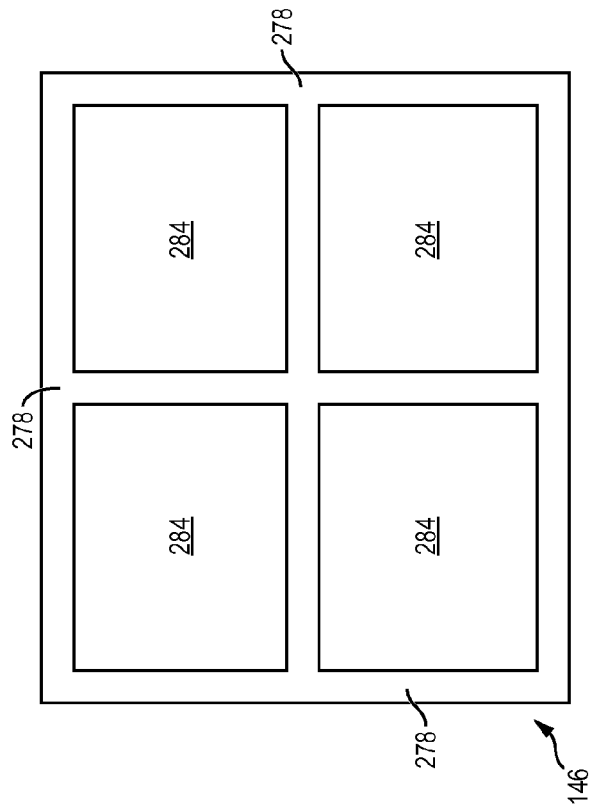
FIG. 10b
FIG. 10c

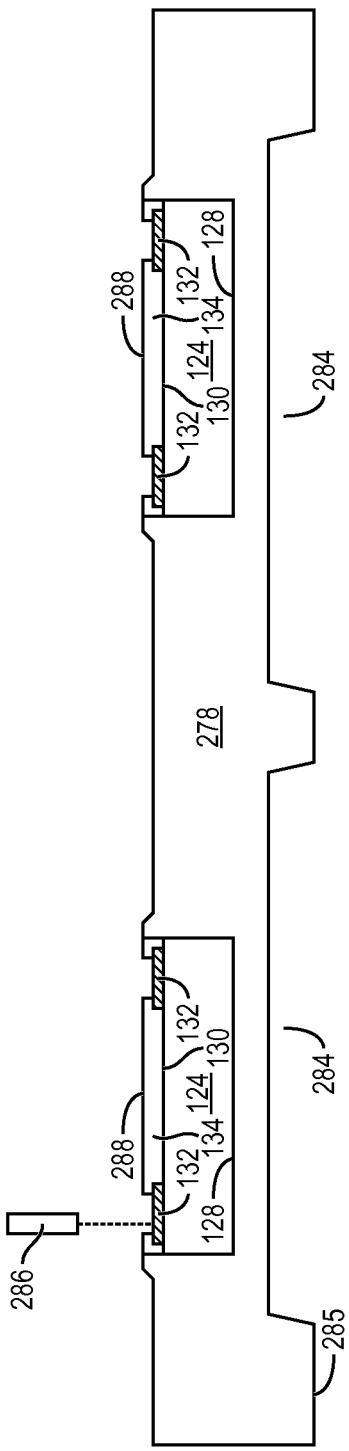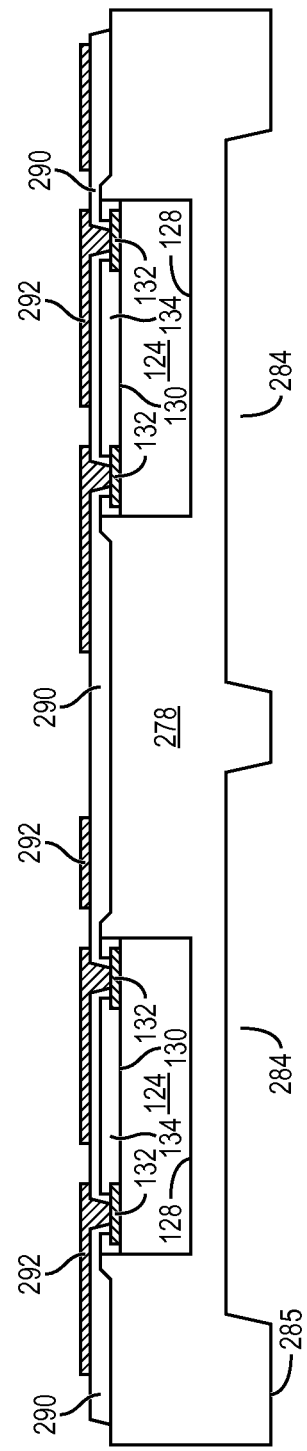

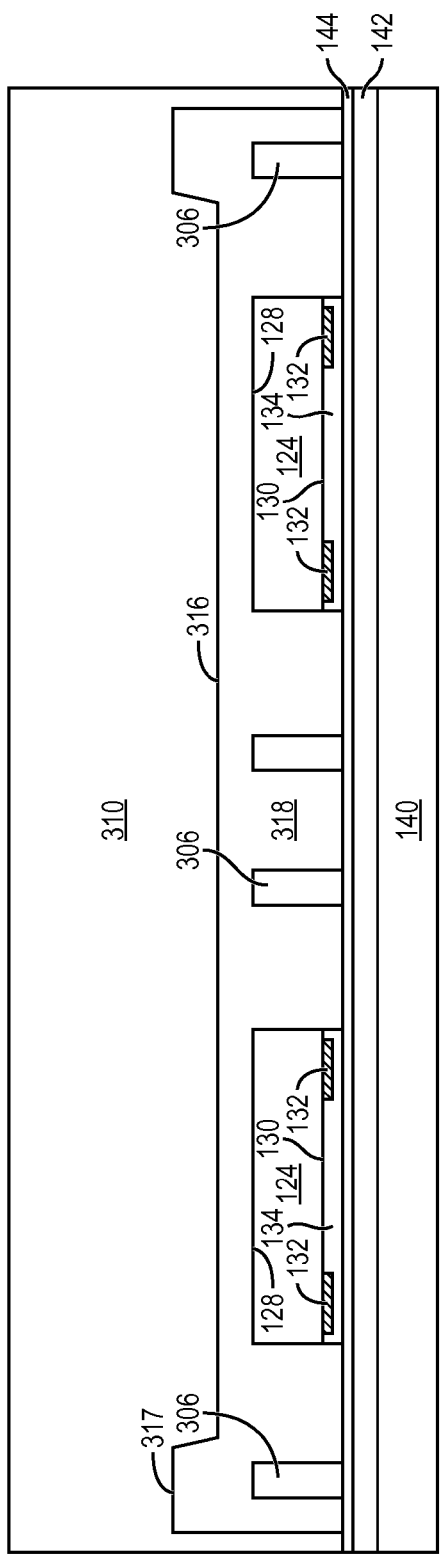
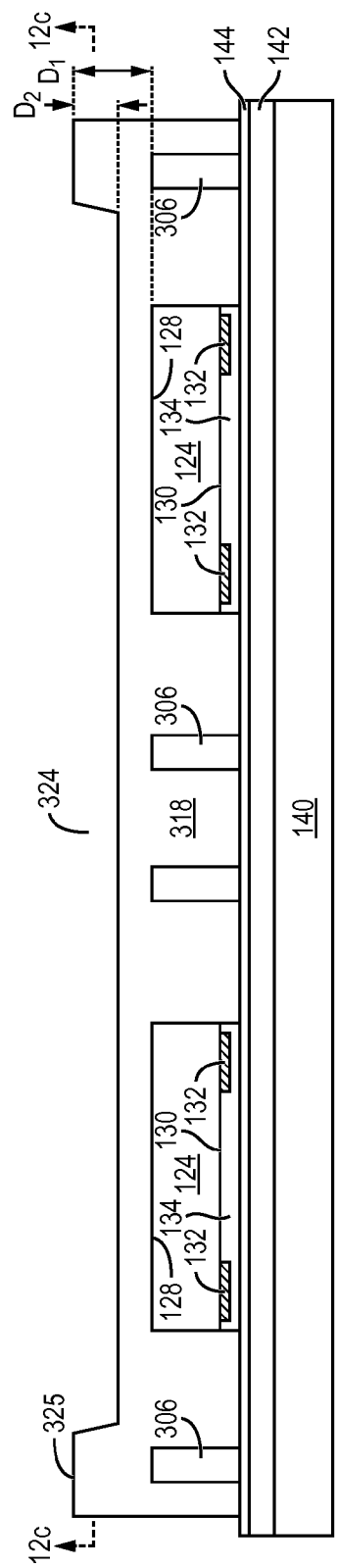

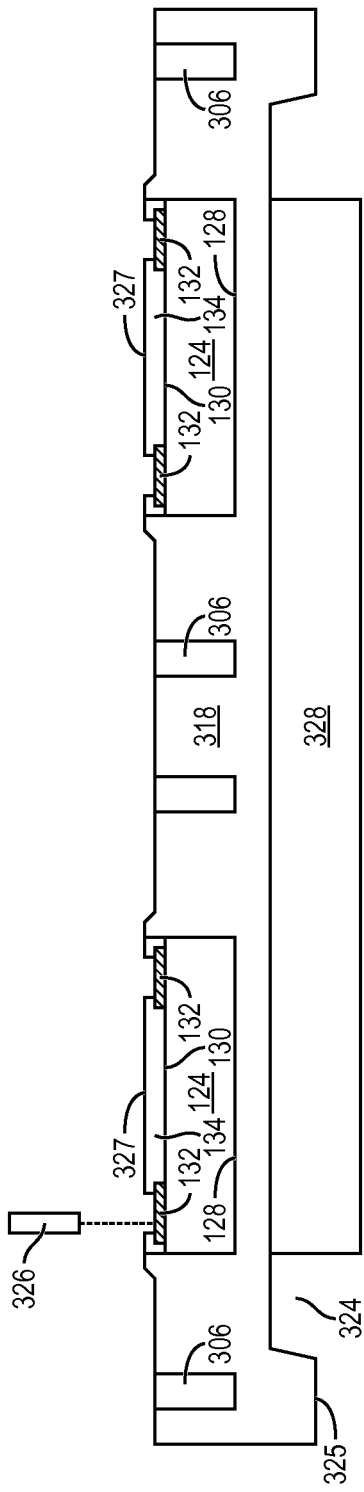
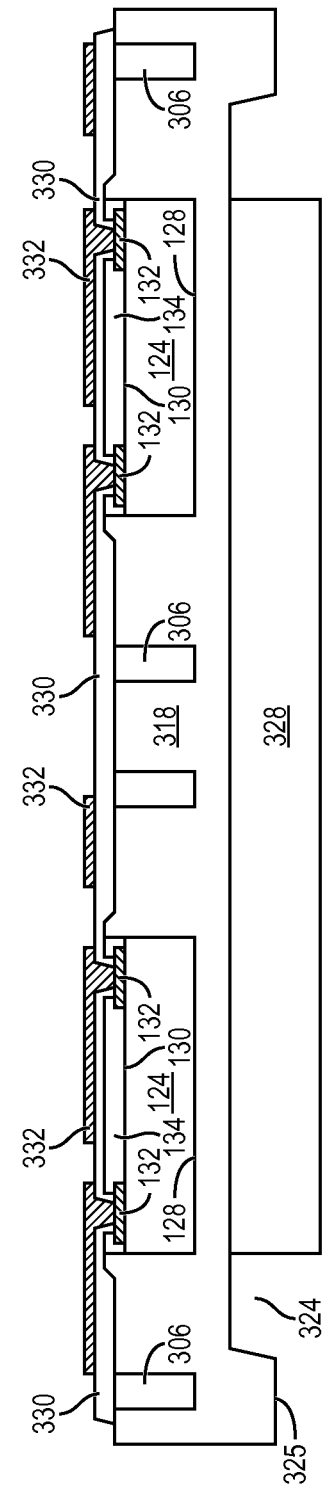
FIG. 12e
FIG. 12f

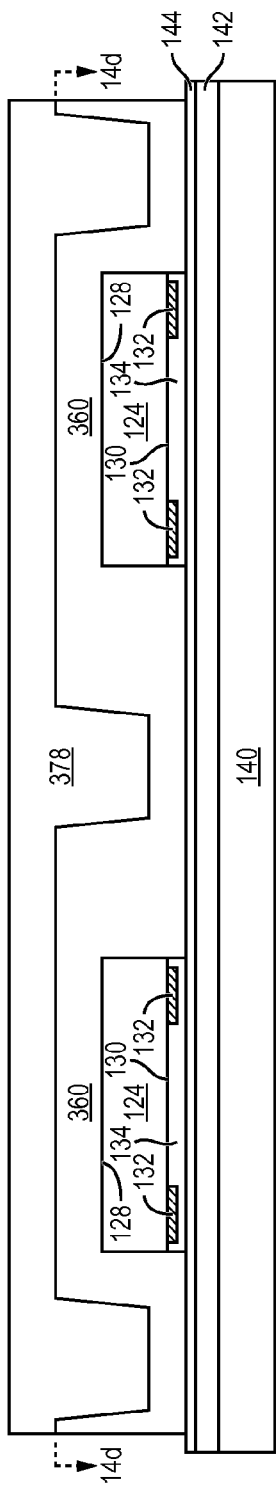
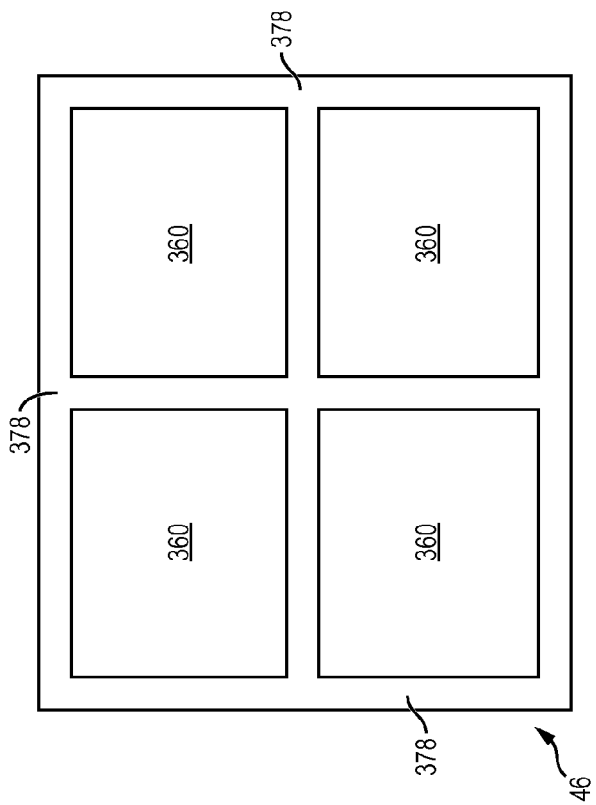

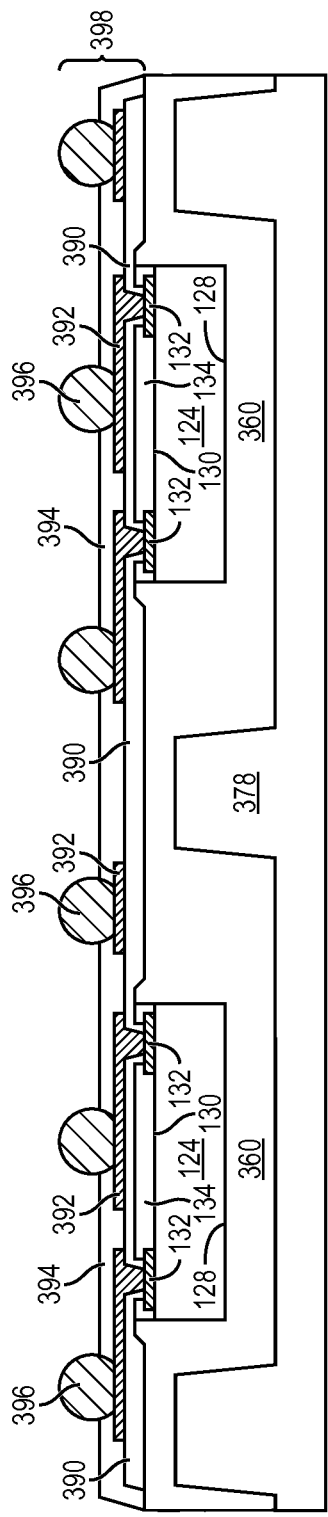
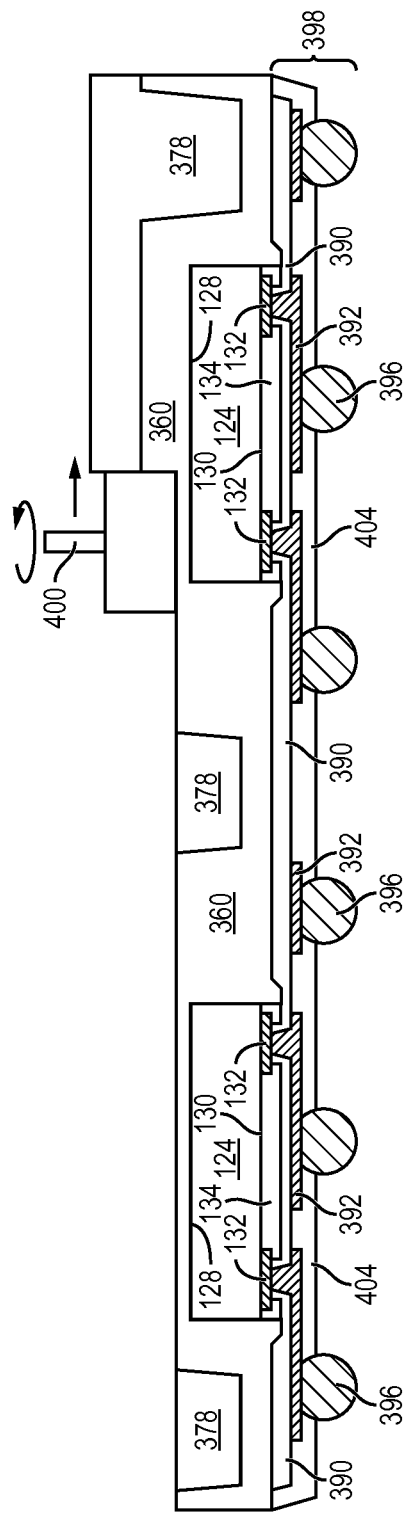

SEMICONDUCTOR DEVICE AND METHOD OF FORMING THICK ENCAPSULANT FOR STIFFNESS WITH RECESSES FOR STRESS RELIEF IN FO-WLCSP

CLAIM TO DOMESTIC PRIORITY

The present application is a continuation of U.S. patent application Ser. No. 13/315,010, now U.S. Pat. No. 8,610,286, filed Dec. 8, 2011, which application is incorporated herein by reference.

FIELD OF THE INVENTION

The present invention relates in general to semiconductor devices and, more particularly, to a semiconductor device and method of forming a thick encapsulant for stiffness with recesses for stress relief in Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional fan-out wafer level chip scale package (Fo-WLCSP) has a semiconductor die mounted to a carrier. An encapsulant is formed over the semiconductor die and carrier. The carrier is removed and a build-up interconnect structure with a redistribution layer (RDL) is formed over the semiconductor die and encapsulant. In many applications, the Fo-WLCSP is made as thin as practical, e.g. by back grinding the encapsulant, to minimize package thickness. The thin Fo-WLCSP is subject to warpage and damages during manufacturing, e.g. formation of the build-up interconnect structure and other handling. The potential for warpage is particularly high when the ratio of the thickness of the encapsulant to the thickness of the semiconductor die is less than 1.5. If the encapsulant is made thicker to increase package stiffness, then mismatches in the coefficient of thermal expansion (CTE) arise between the encapsulant and semiconductor die. The CTE mismatch induces thermal stress, particularly during thermal cycling and other reliability testing, causing cracking and other defects.

SUMMARY OF THE INVENTION

A need exists to maintain package stiffness while providing stress relief for a Fo-WLCSP during manufacturing. Accordingly, in one embodiment, the present invention is a method of making a semiconductor device comprising the steps of providing a first semiconductor die, depositing an encapsulant over the semiconductor die, forming a recess in the encapsulant, forming an interconnect structure over the semiconductor die, and removing a first portion of the encapsulant.

In another embodiment, the present invention is a method of making a semiconductor device comprising the steps of providing a first semiconductor die, depositing a first encapsulant over the first semiconductor die including a first recess formed in the first encapsulant, and forming an interconnect structure over the first semiconductor die.

In another embodiment, the present invention is a semiconductor device comprising a first semiconductor die. A first encapsulant including a first recess is deposited over the first semiconductor die. An interconnect structure is formed over the first semiconductor die.

In another embodiment, the present invention is a semiconductor device comprising a first semiconductor die and an encapsulant including a first recess deposited over the first semiconductor die.

BRIEF DESCRIPTION OF THE DRAWINGS

FIGS. 4a-4k illustrate a process of forming a thick encapsulant for stiffness with channels in the encapsulant for stress relief in a Fo-WLCSP;

FIGS. 6a-6h illustrate another process of forming a thick encapsulant for stiffness with channels in the encapsulant for stress relief in a Fo-WLCSP;

FIGS. 8a-8h illustrate a process of forming a thick encapsulant for stiffness with a recess in the encapsulant for stress relief in a Fo-WLCSP;

FIGS. 10a-10h illustrate a process of forming a thick encapsulant for stiffness with recesses in the encapsulant for stress relief in a Fo-WLCSP;

FIGS. 12a-12i illustrate a process of forming a thick encapsulant and embedded support for stiffness with a recess in the encapsulant for stress relief in a Fo-WLCSP;

FIGS. 14a-14i illustrate a process of forming a dual layer encapsulant for stiffness and stress relief in a Fo-WLCSP.

DETAILED DESCRIPTION OF THE DRAWINGS

Figure 1:
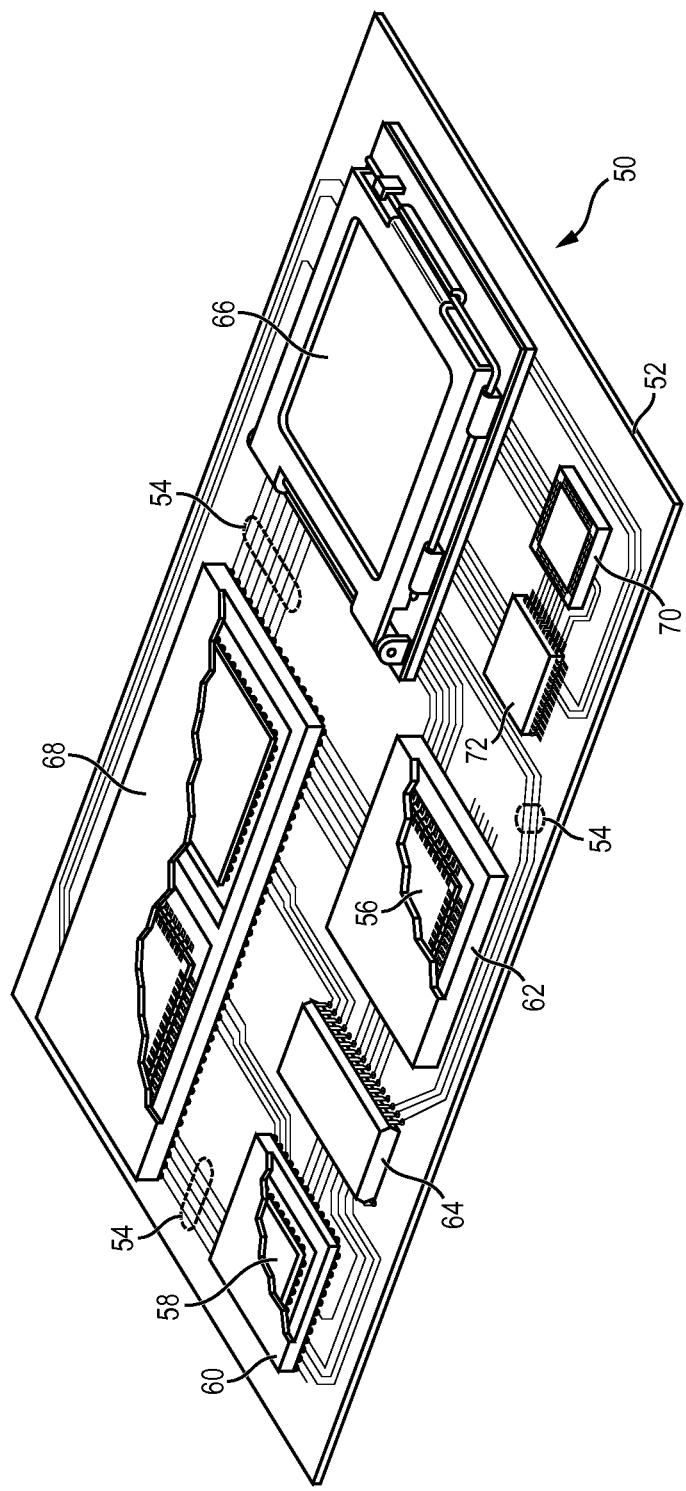
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
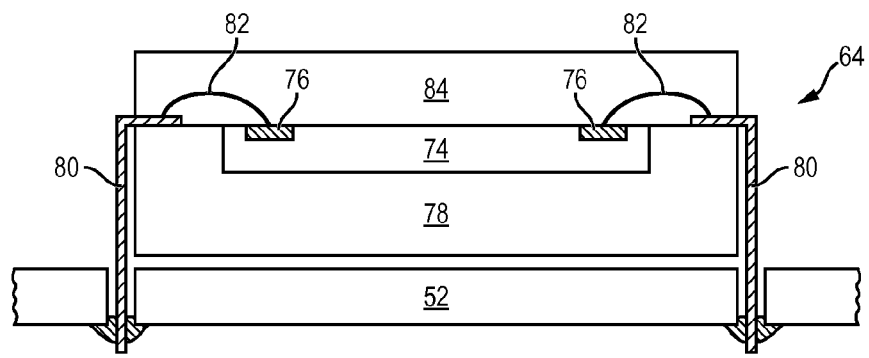
FIGS. 2a-2c illustrate further detail of the representative semiconductor packages mounted to the PCB.
Figure 2B:
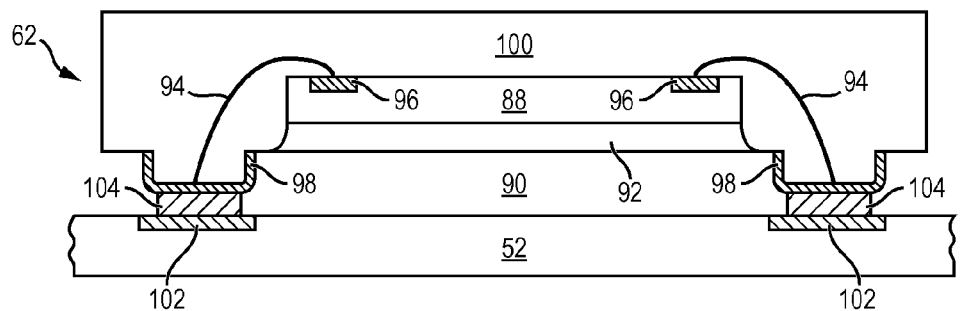
Figure 2C:
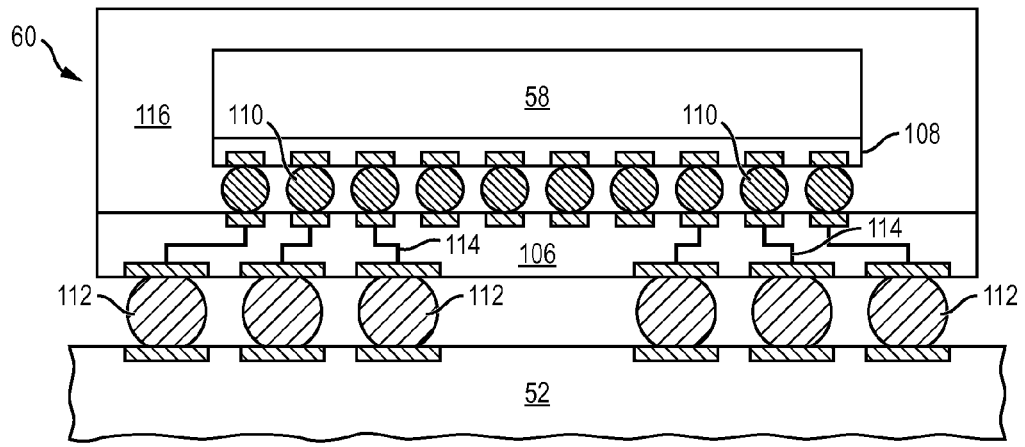

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
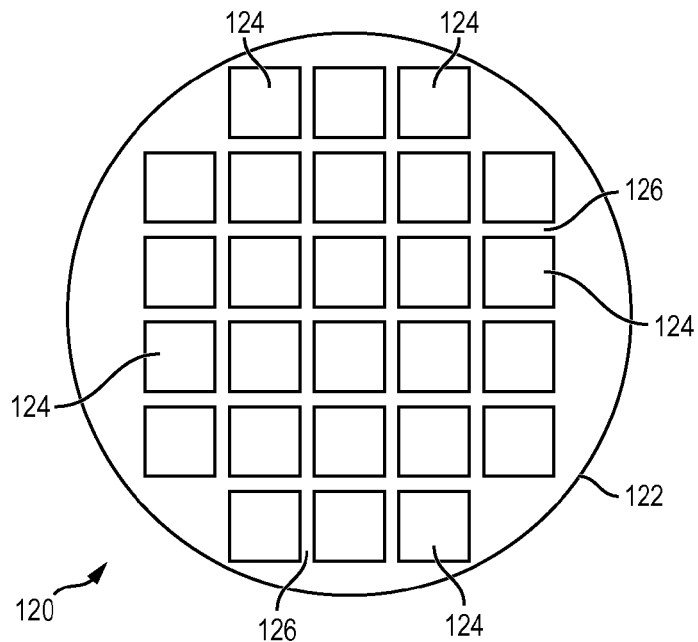
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
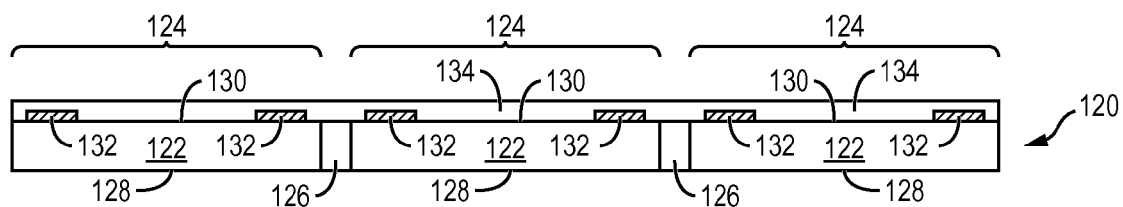

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

Figure 3C:
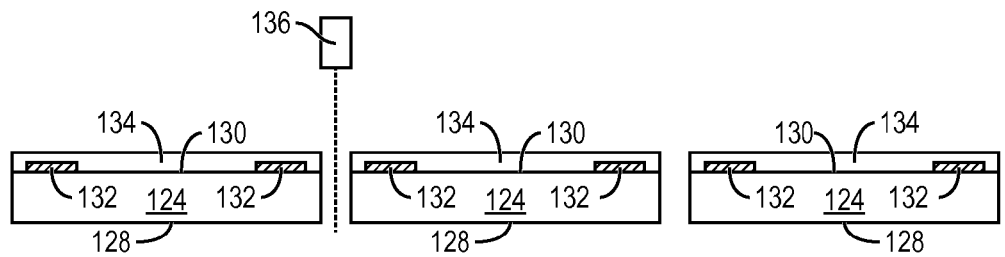

In FIG. 3c, semiconductor wafer 120 is singulated through insulating layer 134 and saw street 126 using a saw blade or laser cutting tool 136 into individual semiconductor die 124.

Figure 4A:
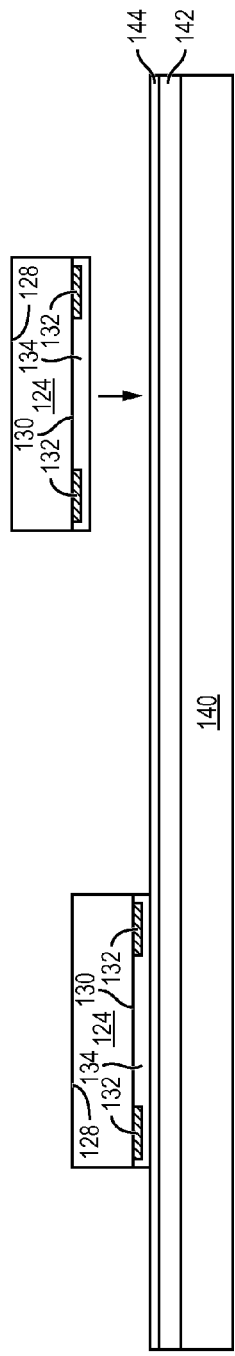

FIGS. 4a-4k illustrate, in relation to FIGS. 1 and 2a-2c, a process of forming a thick encapsulant for stiffness with channels in the encapsulant for stress relief in a Fo-WLCSP. FIG. 4a shows a temporary substrate or carrier 140 containing sacrificial base material such as silicon, polymer, beryllium oxide, glass, or other suitable low-cost, rigid material for structural support. Alternatively, carrier 140 can be metal, such as nickel, platinum, copper, copper alloys (including one or more elements of nickel, iron, zinc, tin, chromium, silver, and phosphorous), or other suitable rigid material for structural support. A carrier tape 142 is applied over carrier 140 and thermally releasable layer 144 is applied over carrier tape 142.

Figure 4B:
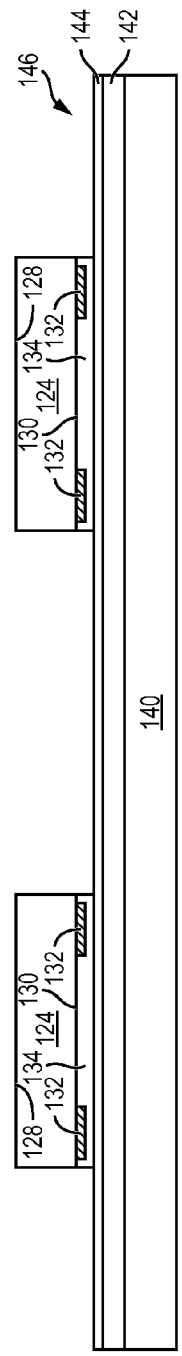

Semiconductor die 124 from FIGS. 3a-3c is positioned over and mounted to carrier 140 using a pick and place operation with active surface 130 oriented toward the carrier. FIG. 4b shows semiconductor die 124 mounted to carrier 140 as reconstituted semiconductor wafer 146.

Figure 4C:
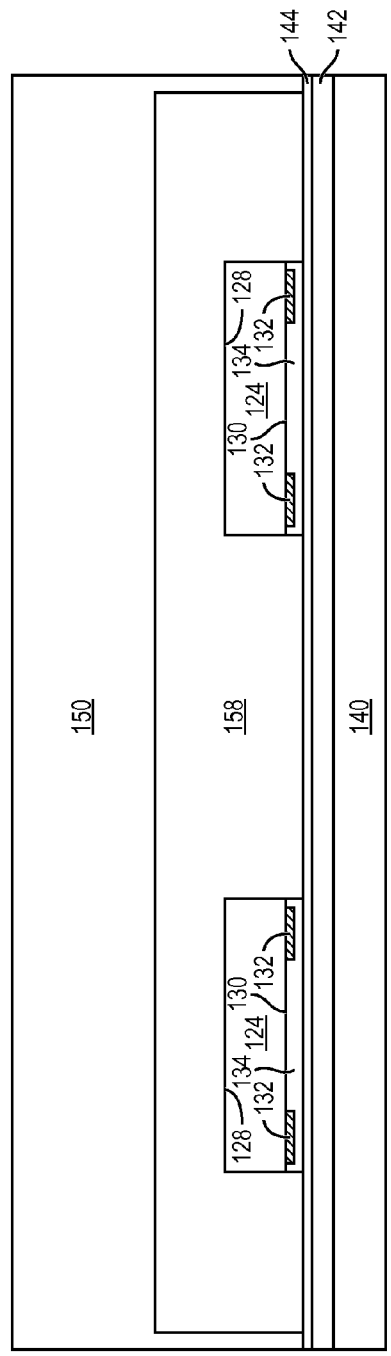
Figure 4F:
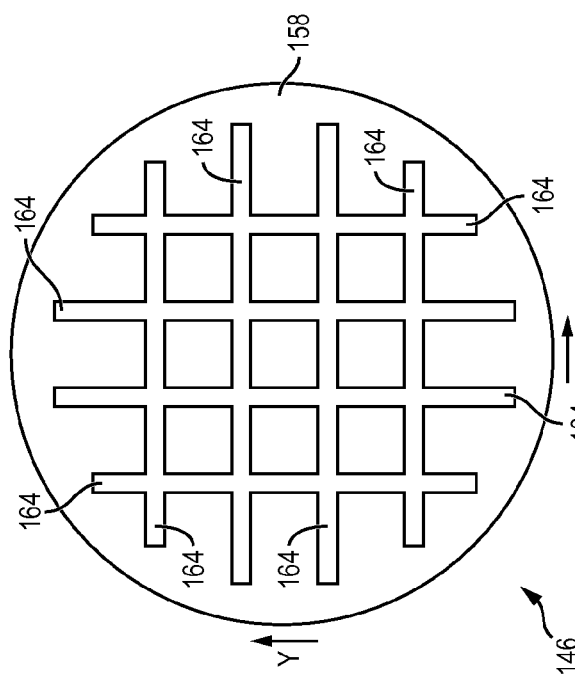

A molding compound or encapsulant 158 is dispensed with liquid or powder, tablet, and granular, or laminated with encapsulant sheet over reconstituted semiconductor wafer 146. Encapsulant 158 can be a polymer composite material, such as epoxy resin with filler, epoxy acrylate with filler, or polymer with proper filler. In FIG. 4c, reconstituted semiconductor wafer 146 with encapsulant 158 is placed into chase mold 150. Encapsulant 158 is evenly dispersed under an elevated temperature around semiconductor die 124 using vacuum compression. In one embodiment, the molding temperature ranges from 80-150° C. with a molding time of 250-1000 seconds. The molding cure temperature ranges from 100-180° C. with a molding cure time of 20-120 minutes.

FIG. 4d shows reconstituted semiconductor wafer 146 covered by encapsulant 158 after removal from chase mold 150. In one embodiment, encapsulant 158 has a thickness D1=40-450 micrometers (μm) with respect to back surface 128 of semiconductor die 124. The thickness D1 of encapsulant 158 provides structure support and stiffness for reconstituted semiconductor wafer 146 during subsequent handling and RDL and bump formation.

In FIG. 4e, a portion of encapsulant 158 is removed from surface 160 by trench grinding or laser cutting tool 162 to form channels or recesses 164 in the encapsulant. Channels 164 are cut in two perpendicular X and Y directions into surface 160 of encapsulant 158, as shown in the plan view of FIG. 4f. In one embodiment, the depth D2 of channels 164 is less than the depth D1 and the width W of channels 164 is less than half a width of semiconductor die 124. The ratio (D1−D2+die thickness)/die thickness ranges from 1.1 to 1.5. The depth D2 of channels 164 provides stress relief and reduces warpage for reconstituted semiconductor wafer 146 during subsequent RDL and bump formation. Channels 164 extend at least partially over semiconductor die 124 to reduce z-direction CTE mismatch between encapsulant 158 and the semiconductor die. Encapsulant 158 can be circular or rectangular in plan view.

Figure 4G:
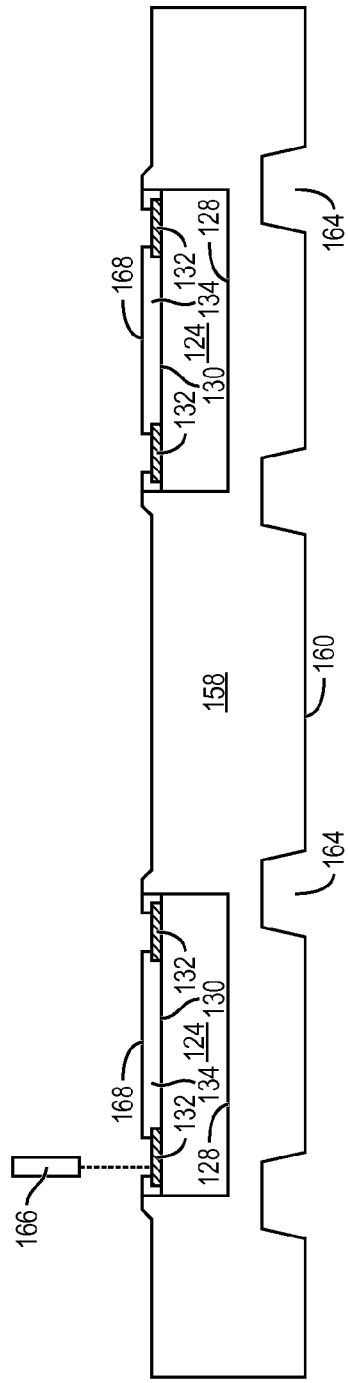

In FIG. 4g, carrier 140, carrier tape 142, and thermally releasable layer 144 are removed by chemical etching, mechanical peeling, CMP, mechanical grinding, thermal bake, UV light, laser scanning, or wet stripping to expose insulating layer 134 and encapsulant 158. A portion of insulating layer 134 is removed by an etching process through a patterned photoresist layer to expose conductive layer 132. Alternatively, a portion of insulating layer 134 is removed by laser direct ablation (LDA) using laser 166. The etching or LDA process also removes a portion of encapsulant 158 outside a footprint of semiconductor die 124 to a level below surface 168 of insulating layer 134.

In FIG. 4h, an insulating or passivation layer 170 is formed over encapsulant 158, insulating layer 134, and conductive layer 132 using PVD, CVD, printing, spin coating, spray coating, lamination, sintering or thermal oxidation. The insulating layer 170 contains one or more layers of SiO2, Si3N4, SiON, Ta2O5, Al2O3, or other material having similar insulating and structural properties. A portion of insulating layer 170 is removed by an etching process through a patterned photoresist layer to expose conductive layer 132.

An electrically conductive layer 172 is formed insulating layer 170 and conductive layer 132 using a patterning and metal deposition process such as printing, PVD, CVD, sputtering, electrolytic plating, and electroless plating. Conductive layer 172 can be one or more layers of Al, Cu, Sn, Ti, Ni, Au, Ag, or other suitable electrically conductive material. A portion of conductive layer 172 extends horizontally along insulating layer 170 and parallel to active surface 130 of semiconductor die 124 to laterally redistribute the electrical interconnect to conductive layer 132. Conductive layer 172 operates as a fan-out redistribution layer (RDL) for the electrical signals of semiconductor die 124. A portion of conductive layer 172 is electrically connected to conductive layer 132. Other portions of conductive layer 172 are electrically common or electrically isolated depending on the connectivity of semiconductor die 124.

In FIG. 4i, an insulating or passivation layer 174 is formed over insulating layer 170 and conductive layer 172 using PVD, CVD, printing, spin coating, spray coating, screen printing or lamination. The insulating layer 174 can be one or more layers of SiO2, Si3N4, SiON, Ta2O5, Al2O3, or other material having similar insulating and structural properties. A portion of insulating layer 174 is removed by an etching process with a patterned photoresist layer to expose conductive layer 172.

An electrically conductive bump material is deposited over the exposed conductive layer 172 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form balls or bumps 176. In some applications, bumps 176 are reflowed a second time to improve electrical contact to conductive layer 172. Bumps 176 can also be compression bonded to conductive layer 172. Bumps 176 represent one type of interconnect structure that can be formed over conductive layer 172. The interconnect structure can also use stud bump, micro bump, or other electrical interconnect.

The combination of insulating layers 170 and 174, conductive layers 172, and bumps 176 constitute a build-up interconnect structure 178 formed over semiconductor die 124 and encapsulant 158. Additional insulating layers and RDLs can be formed in build-up interconnect structure 178 for interconnection to semiconductor die 124.

Figure 4J:
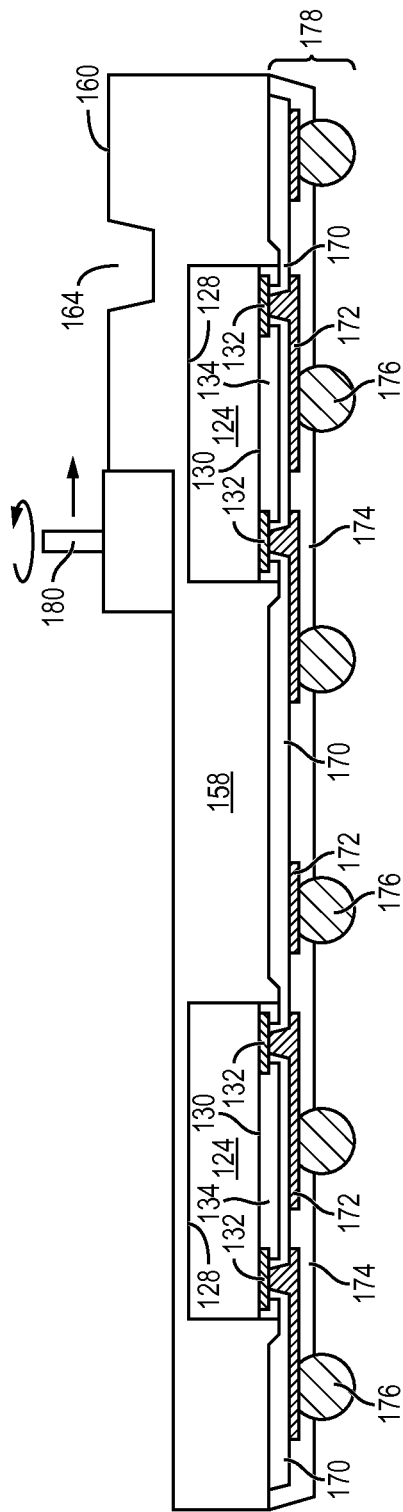
Figure 4K:
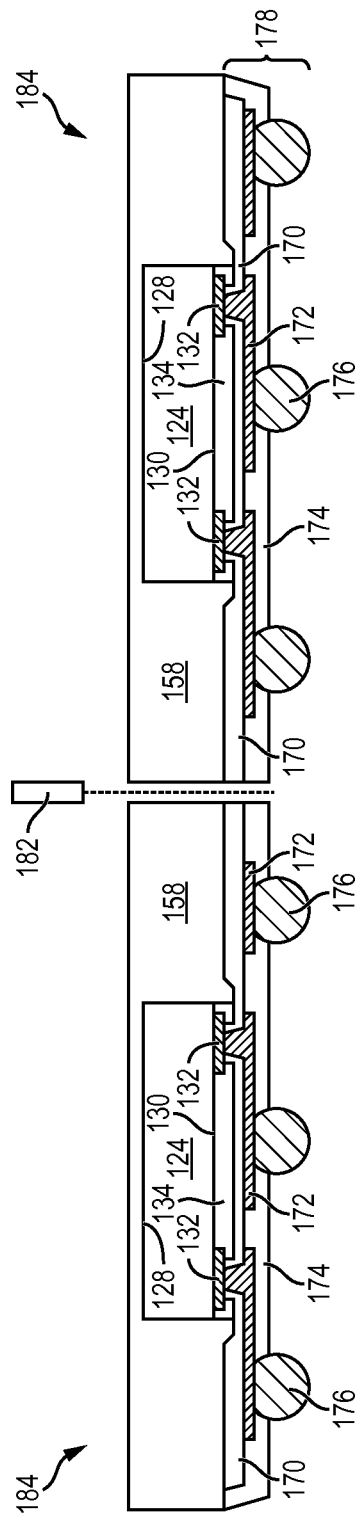

In FIG. 4j, a portion of encapsulant 158 is removed by grinder 180 to planarize the encapsulant and reduce the thickness of reconstituted semiconductor wafer 146. Channels 164 are completely removed during planarization. Encapsulant 158 can also be planarized by an etching process or CMP. FIG. 4k shows reconstituted semiconductor wafer 146 having reduced thickness after the grinding operation. In one embodiment, encapsulant 158 remains covering back surface 128 of semiconductor die 124 with a thickness of 10 μm for environmental protection and laser marking. Alternatively, the grinding operation exposes back surface 128 of semiconductor die 124.

The reconstituted semiconductor wafer 146 is singulated through encapsulant 158 and build-up interconnect structure 178 with saw blade or laser cutting tool 182 into individual Fo-WLCSP 184.

Figure 5:
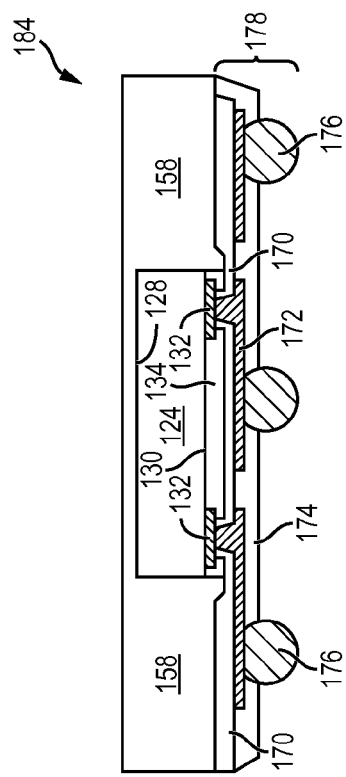
FIG. 5 illustrates the Fo-WLCSP formed from a thick encapsulant for stiffness with channels in the encapsulant for stress relief according to FIGS. 4a-4k.

FIG. 5 shows Fo-WLCSP 184 after singulation. Conductive layer 132 of semiconductor die 124 is electrically connected to conductive layer 172 and bumps 176. Fo-WLCSP 184 is formed from reconstituted semiconductor wafer 146 with a thick encapsulant 158 formed over semiconductor die 124 and carrier 140 for structural support and stiffness during RDL and bump formation. Channels 164 are formed in the X and Y directions in encapsulant 158 for stress relief and to reduce warpage of reconstituted semiconductor wafer 146. The combination of a thick encapsulant 158 with channels 164 provides an effective balance between structural support and stiffness during RDL and bump formation as well as stress relief and reduced warpage of reconstituted semiconductor wafer 146. Channels 164 extend at least partially over semiconductor die 124 to reduce z-direction CTE mismatch between encapsulant 158 and the semiconductor die. Encapsulant 158 undergoes back grinding to completely remove channels 164 and reduce the thickness of Fo-WLCSP 184.

Figure 6A:
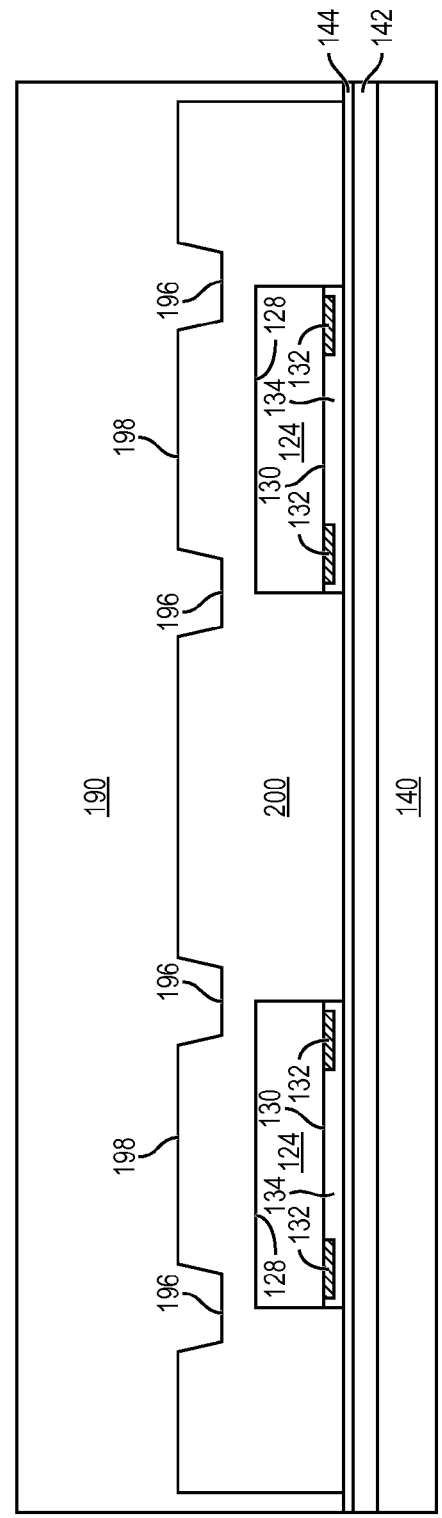

FIGS. 6a-6h illustrate, in relation to FIGS. 1 and 2a-2c, another process of forming a thick encapsulant for stiffness with recesses in the encapsulant for stress relief in a Fo-WLCSP. Continuing from FIG. 4b, a molding compound or encapsulant 200 is dispensed with liquid or powder, tablet, and granular, or laminated with encapsulant sheet over reconstituted semiconductor wafer 146. Encapsulant 200 can be a polymer composite material, such as epoxy resin with filler, epoxy acrylate with filler, or polymer with proper filler. In FIG. 6a, reconstituted semiconductor wafer 146 with encapsulant 200 is placed into chase mold 190. Chase mold 190 includes protrusions or surfaces 196 extending from surface 198. Encapsulant 200 is evenly dispersed under an elevated temperature around semiconductor die 124 and protrusions 196 using vacuum compression. In one embodiment, the molding temperature ranges from 80-150° C. with a molding time of 250-1000 seconds. The molding cure temperature ranges from 100-180° C. with a molding cure time of 20-120 minutes.

Figure 6B:
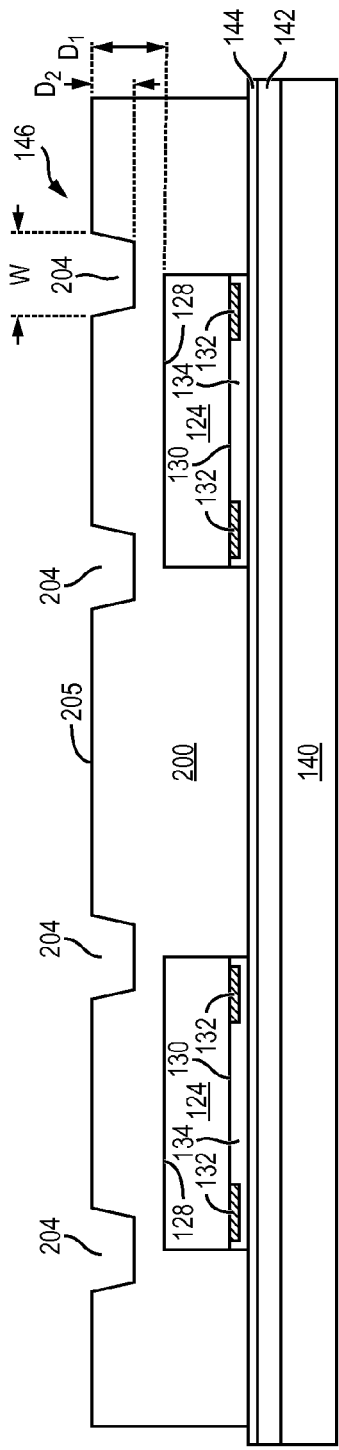
Figure 6C:
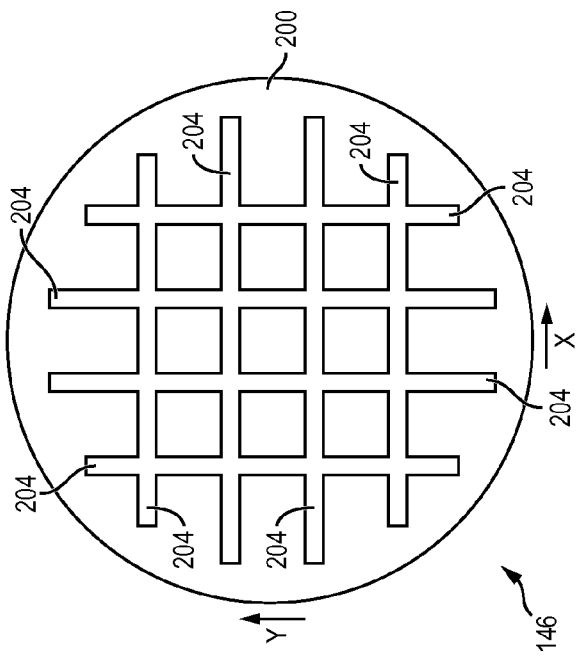

FIG. 6b shows reconstituted semiconductor wafer 146 covered by encapsulant 200 after removal from chase mold 190. In one embodiment, encapsulant 200 has a thickness D1=40-450 μm with respect to back surface 128 of semiconductor die 124. The thickness D1 of encapsulant 200 provides structure support and stiffness for reconstituted semiconductor wafer 146 during subsequent handling and RDL and bump formation.

The extended surfaces 196 of chase mold 190 leave channels or recesses 204 in surface 205 of encapsulant 200. Recesses 204 are formed in two perpendicular X and Y directions of encapsulant 200, as shown in the plan view of FIG. 6c. In one embodiment, the depth D2 of recesses 204 is less than the depth D1 and the width W of recesses 204 is less than half a width of semiconductor die 124. The ratio (D1−D2+die thickness)/die thickness ranges from 1.1 to 1.5. The depth D2 of recesses 204 provides stress relief and reduced warpage for reconstituted semiconductor wafer 146 during subsequent RDL and bump formation. Recesses 204 extend at least partially over semiconductor die 124 to reduce z-direction CTE mismatch between encapsulant 200 and the semiconductor die. Encapsulant 200 can be circular or rectangular in plan view.

In FIG. 6d, carrier 140, carrier tape 142, and thermally releasable layer 144 are removed by chemical etching, mechanical peeling, CMP, mechanical grinding, thermal bake, UV light, laser scanning, or wet stripping to expose insulating layer 134 and encapsulant 200. A portion of insulating layer 134 is removed by an etching process through a patterned photoresist layer to expose conductive layer 132. Alternatively, a portion of insulating layer 134 is removed by LDA using laser 206. The etching or LDA process also removes a portion of encapsulant 200 outside a footprint of semiconductor die 124 to a level below surface 208 of insulating layer 134.

In FIG. 6e, an insulating or passivation layer 210 is formed over encapsulant 200, insulating layer 134, and conductive layer 132 using PVD, CVD, printing, spin coating, spray coating, lamination, sintering or thermal oxidation. The insulating layer 210 contains one or more layers of SiO2, Si3N4, SiON, Ta2O5, Al2O3, or other material having similar insulating and structural properties. A portion of insulating layer 210 is removed by an etching process through a patterned photoresist layer to expose conductive layer 132.

An electrically conductive layer 212 is formed insulating layer 210 and conductive layer 132 using a patterning and metal deposition process such as printing, PVD, CVD, sputtering, electrolytic plating, and electroless plating. Conductive layer 212 can be one or more layers of Al, Cu, Sn, Ti, Ni, Au, Ag, or other suitable electrically conductive material. A portion of conductive layer 212 extends horizontally along insulating layer 210 and parallel to active surface 130 of semiconductor die 124 to laterally redistribute the electrical interconnect to conductive layer 132. Conductive layer 212 operates as a fan-out RDL for the electrical signals of semiconductor die 124. A portion of conductive layer 212 is electrically connected to conductive layer 132. Other portions of conductive layer 212 are electrically common or electrically isolated depending on the connectivity of semiconductor die 124.

Figure 6F:
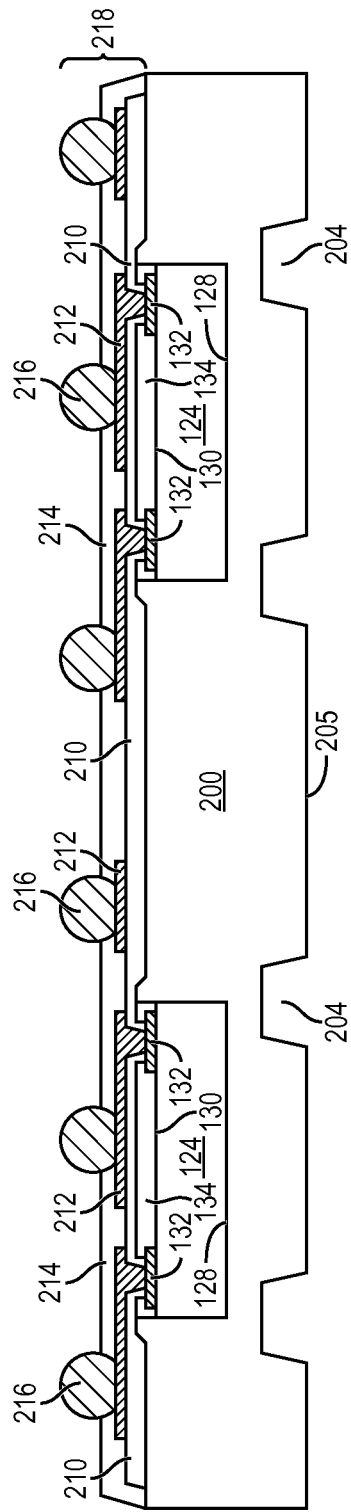

In FIG. 6f, an insulating or passivation layer 214 is formed over insulating layer 210 and conductive layer 212 using PVD, CVD, printing, spin coating, spray coating, screen printing or lamination. The insulating layer 214 can be one or more layers of SiO2, Si3N4, SiON, Ta2O5, Al2O3, or other material having similar insulating and structural properties. A portion of insulating layer 214 is removed by an etching process with a patterned photoresist layer to expose conductive layer 212.

An electrically conductive bump material is deposited over the exposed conductive layer 212 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form balls or bumps 216. In some applications, bumps 216 are reflowed a second time to improve electrical contact to conductive layer 212. Bumps 216 can also be compression bonded to conductive layer 212. Bumps 216 represent one type of interconnect structure that can be formed over conductive layer 212. The interconnect structure can also use stud bump, micro bump, or other electrical interconnect.

The combination of insulating layers 210 and 214, conductive layers 212, and bumps 216 constitute a build-up interconnect structure 218 formed over semiconductor die 124 and encapsulant 200. Additional insulating layers and RDLs can be formed in build-up interconnect structure 218 for interconnection to semiconductor die 124.

Figure 6G:
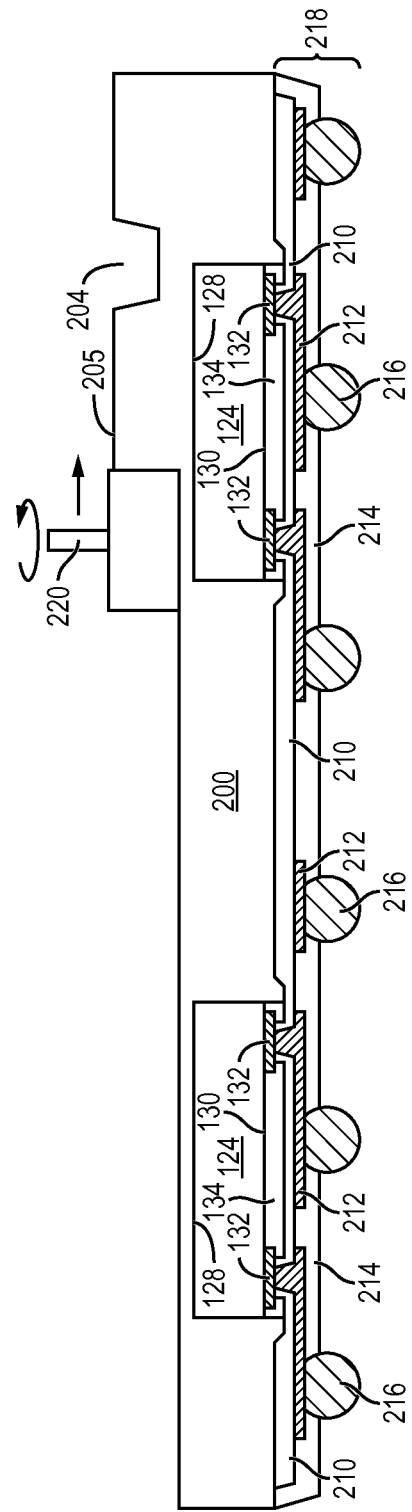
Figure 6H:
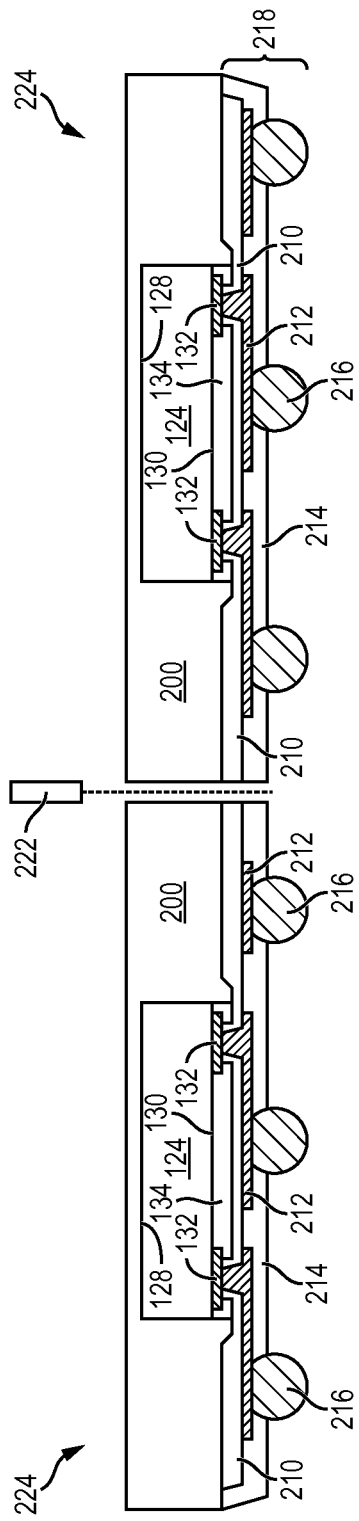

In FIG. 6g, a portion of encapsulant 200 is removed by grinder 220 to planarize the encapsulant and reduce the thickness of reconstituted semiconductor wafer 146. Recesses 204 are completely removed during planarization. Encapsulant 200 can also be planarized by an etching process or CMP. FIG. 6h shows reconstituted semiconductor wafer 146 having reduced thickness after the grinding operation. In one embodiment, encapsulant 200 remains covering back surface 128 of semiconductor die 124 with a thickness of 10 μm for environmental protection and laser marking. Alternatively, the grinding operation exposes back surface 128 of semiconductor die 124.

The reconstituted semiconductor wafer 146 is singulated through encapsulant 200 and build-up interconnect structure 218 with saw blade or laser cutting tool 222 into individual Fo-WLCSP 224.

Figure 7:
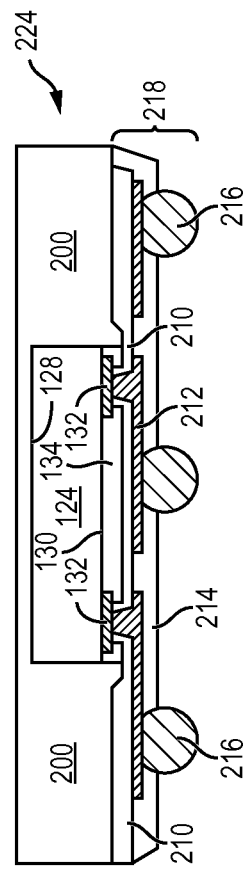
FIG. 7 illustrates the Fo-WLCSP formed from a thick encapsulant for stiffness with channels in the encapsulant for stress relief according to FIGS. 6a-6h.

FIG. 7 shows Fo-WLCSP 224 after singulation. Conductive layer 132 of semiconductor die 124 is electrically connected to conductive layer 212 and bumps 216. Fo-WLCSP 224 is formed from reconstituted semiconductor wafer 146 with a thick encapsulant 200 formed over semiconductor die 124 and carrier 140 for structural support and stiffness during RDL and bump formation. Recesses 204 are formed in the X and Y directions in encapsulant 200 for stress relief and to reduce warpage of reconstituted semiconductor wafer 146. The combination of a thick encapsulant 200 with recesses 204 provides an effective balance between structural support and stiffness during RDL and bump formation as well as stress relief and reduced warpage of reconstituted semiconductor wafer 146. Recesses 204 extend at least partially over semiconductor die 124 to reduce z-direction CTE mismatch between encapsulant 200 and the semiconductor die. Encapsulant 200 undergoes back grinding to completely remove recesses 204 and reduce the thickness of Fo-WLCSP 224.

FIGS. 8a-8h illustrate, in relation to FIGS. 1 and 2a-2c, a process of forming a thick encapsulant for stiffness with a recess in the encapsulant for stress relief in a Fo-WLCSP. Continuing from FIG. 4b, a molding compound or encapsulant 238 is dispensed with liquid or powder, tablet, and granular, or laminated with encapsulant sheet over reconstituted semiconductor wafer 146. Encapsulant 238 can be a polymer composite material, such as epoxy resin with filler, epoxy acrylate with filler, or polymer with proper filler. In FIG. 8a, reconstituted semiconductor wafer 146 with encapsulant 238 is placed into chase mold 230. Chase mold 230 includes a surface 236 extending from surface 237. Encapsulant 238 is evenly dispersed under an elevated temperature around semiconductor die 124 and extended surface 236 using vacuum compression. In one embodiment, the molding temperature ranges from 80-150° C. with a molding time of 250-1000 seconds. The molding cure temperature ranges from 100-180° C. with a molding cure time of 20-120 minutes.

FIG. 8b shows reconstituted semiconductor wafer 146 covered by encapsulant 238 after removal from chase mold 230. In one embodiment, encapsulant 238 has a thickness D1=40-450 μm with respect to back surface 128 of semiconductor die 124. The thickness D1 of encapsulant 238 provides structure support and stiffness for reconstituted semiconductor wafer 146 during subsequent handling and RDL and bump formation.

The extended surface 236 of chase mold 190 leaves a recess 244 from surface 245 into encapsulant 238. In one embodiment, the depth D2 of recess 244 is less than the depth D1 and the width W of recess 244 is less than half a width of semiconductor die 124. The ratio (D1-D2+die thickness)/die thickness ranges from 1.1 to 1.5. The depth D2 of recess 244 provides stress relief and reduced warpage for reconstituted semiconductor wafer 146 during subsequent RDL and bump formation. FIG. 8c shows a plan view of recess 244 in encapsulant 238. Encapsulant 238 can be circular or rectangular in plan view.

In FIG. 8d, carrier 140, carrier tape 142, and thermally releasable layer 144 are removed by chemical etching, mechanical peeling, CMP, mechanical grinding, thermal bake, UV light, laser scanning, or wet stripping to expose insulating layer 134 and encapsulant 238. A portion of insulating layer 134 is removed by an etching process through a patterned photoresist layer to expose conductive layer 132.

Alternatively, a portion of insulating layer 134 is removed by LDA using laser 246. The etching or LDA process also removes a portion of encapsulant 238 outside a footprint of semiconductor die 124 to a level below surface 247 of insulating layer 134. The reconstituted semiconductor wafer 146 is placed on chuck 248 for handling and structural support. Chuck 248 is partially disposed within recess 244.

In FIG. 8e, an insulating or passivation layer 250 is formed over encapsulant 238, insulating layer 134, and conductive layer 132 using PVD, CVD, printing, spin coating, spray coating, lamination, sintering or thermal oxidation. The insulating layer 250 contains one or more layers of SiO2, Si3N4, SiON, Ta2O5, Al2O3, or other material having similar insulating and structural properties. A portion of insulating layer 250 is removed by an etching process through a patterned photoresist layer to expose conductive layer 132.

An electrically conductive layer 252 is formed insulating layer 250 and conductive layer 132 using a patterning and metal deposition process such as printing, PVD, CVD, sputtering, electrolytic plating, and electroless plating. Conductive layer 252 can be one or more layers of Al, Cu, Sn, Ti, Ni, Au, Ag, or other suitable electrically conductive material. A portion of conductive layer 252 extends horizontally along insulating layer 250 and parallel to active surface 130 of semiconductor die 124 to laterally redistribute the electrical interconnect to conductive layer 132. Conductive layer 252 operates as a fan-out RDL for the electrical signals of semiconductor die 124. A portion of conductive layer 252 is electrically connected to conductive layer 132. Other portions of conductive layer 252 are electrically common or electrically isolated depending on the connectivity of semiconductor die 124.

In FIG. 8f, an insulating or passivation layer 254 is formed over insulating layer 250 and conductive layer 252 using PVD, CVD, printing, spin coating, spray coating, screen printing or lamination. The insulating layer 254 can be one or more layers of SiO2, Si3N4, SiON, Ta2O5, Al2O3, or other material having similar insulating and structural properties. A portion of insulating layer 254 is removed by an etching process with a patterned photoresist layer to expose conductive layer 252.

An electrically conductive bump material is deposited over the exposed conductive layer 252 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 252 using a suitable attachment or bonding process. In one embodiment, the bump material is reflowed by heating the material above its melting point to form balls or bumps 256. In some applications, bumps 256 are reflowed a second time to improve electrical contact to conductive layer 252. Bumps 256 can also be compression bonded to conductive layer 252. Bumps 256 represent one type of interconnect structure that can be formed over conductive layer 252. The interconnect structure can also use stud bump, micro bump, or other electrical interconnect.

The combination of insulating layers 250 and 254, conductive layers 252, and bumps 256 constitute a build-up interconnect structure 258 formed over semiconductor die 124 and encapsulant 238. Additional insulating layers and RDLs can be formed in build-up interconnect structure 258 for interconnection to semiconductor die 124.

In FIG. 8g, chuck 248 is removed and a portion of encapsulant 238 is removed by grinder 260 to planarize the encapsulant and reduce the thickness of reconstituted semiconductor wafer 146. Recess 244 is completely removed during planarization. Encapsulant 238 can also be planarized by an etching process or CMP. FIG. 8h shows reconstituted semiconductor wafer 146 having reduced thickness after the grinding operation. In one embodiment, encapsulant 238 remains covering back surface 128 of semiconductor die 124 with a thickness of 10 μm for environmental protection and laser marking. Alternatively, the grinding operation exposes back surface 128 of semiconductor die 124.

The reconstituted semiconductor wafer 146 is singulated through encapsulant 238 and build-up interconnect structure 258 with saw blade or laser cutting tool 262 into individual Fo-WLCSP 264.

Figure 9:
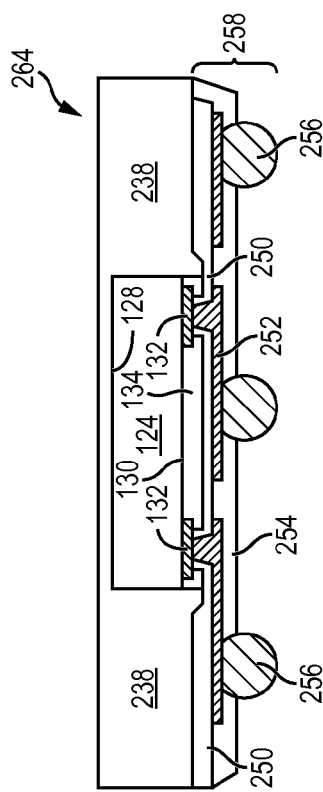
FIG. 9 illustrates the Fo-WLCSP formed from a thick encapsulant for stiffness with a recess in the encapsulant for stress relief according to FIGS. 8a-8h.

FIG. 9 shows Fo-WLCSP 264 after singulation. Conductive layer 132 of semiconductor die 124 is electrically connected to conductive layer 252 and bumps 256. Fo-WLCSP 264 is formed from reconstituted semiconductor wafer 146 with a thick encapsulant 238 formed over semiconductor die 124 and carrier 140 for structural support and stiffness during RDL and bump formation. Recess 244 is formed in encapsulant 238 for stress relief and to reduce warpage of reconstituted semiconductor wafer 146. The combination of a thick encapsulant 238 with recess 244 provides an effective balance between structural support and stiffness during RDL and bump formation as well as stress relief and reduced warpage of reconstituted semiconductor wafer 146. Encapsulant 238 undergoes back grinding to completely remove recess 244 and reduce the thickness of Fo-WLCSP 264.

Figure 10A:
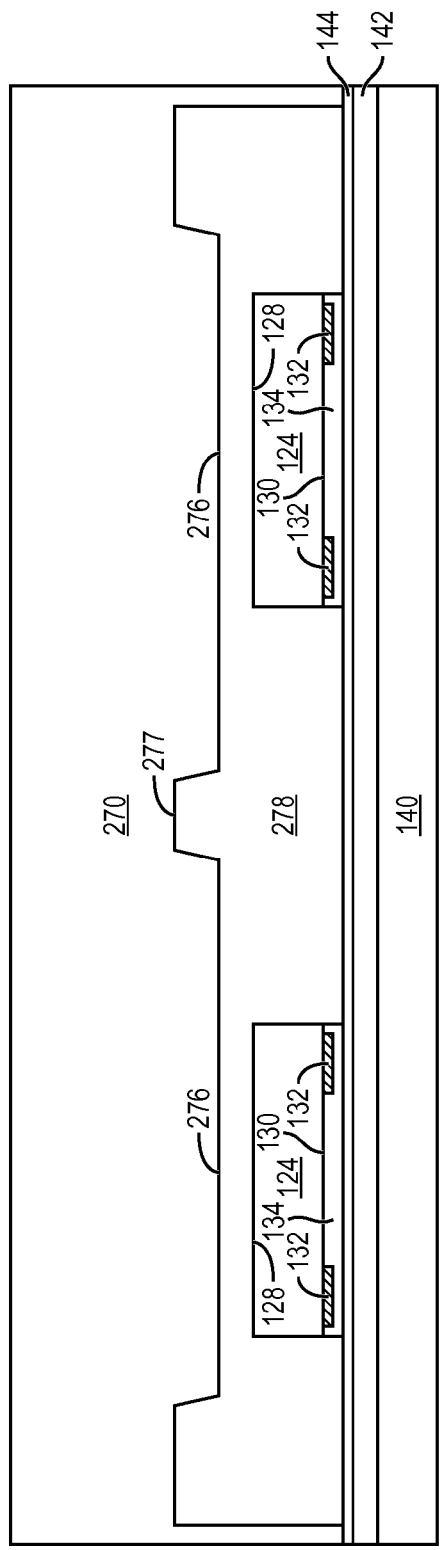

FIGS. 10a-10h illustrate, in relation to FIGS. 1 and 2a-2c, a process of forming a thick encapsulant for stiffness with recesses in the encapsulant for stress relief in a Fo-WLCSP. Continuing from FIG. 4b, a molding compound or encapsulant 278 is dispensed with liquid or powder, tablet, and granular, or laminated with encapsulant sheet over reconstituted semiconductor wafer 146. Encapsulant 278 can be a polymer composite material, such as epoxy resin with filler, epoxy acrylate with filler, or polymer with proper filler. In FIG. 10a, reconstituted semiconductor wafer 146 with encapsulant 278 is placed into chase mold 270. Chase mold 270 includes surfaces 276 extending from surface 277. Encapsulant 278 is evenly dispersed under an elevated temperature around semiconductor die 124 and extended surfaces 276 using vacuum compression. In one embodiment, the molding temperature ranges from 80-150° C. with a molding time of 250-1000 seconds. The molding cure temperature ranges from 100-180° C. with a molding cure time of 20-120 minutes.

FIG. 10b shows reconstituted semiconductor wafer 146 covered by encapsulant 278 after removal from chase mold 270. In one embodiment, encapsulant 278 has a thickness D1=40-450 μm with respect to back surface 128 of semiconductor die 124. The thickness D1 of encapsulant 278 provides structure support and stiffness for reconstituted semiconductor wafer 146 during subsequent handling and RDL and bump formation.

The extended surfaces 276 of chase mold 270 leave recesses 284 from surface 285 into encapsulant 278. In one embodiment, the depth D2 of recess 284 is less than the depth D1 and the width W of recess 284 is less than half a width of semiconductor die 124. The ratio (D1−D2+die thickness)/die thickness ranges from 1.1 to 1.5. The depth D2 of recesses 284 provides stress relief and reduced warpage for reconstituted semiconductor wafer 146 during subsequent RDL and bump formation. FIG. 10c shows a plan view of recesses 284 in encapsulant 278. Encapsulant 278 can be circular or rectangular in plan view.

In FIG. 10d, carrier 140, carrier tape 142, and thermally releasable layer 144 are removed by chemical etching, mechanical peeling, CMP, mechanical grinding, thermal bake, UV light, laser scanning, or wet stripping to expose insulating layer 134 and encapsulant 278. A portion of insulating layer 134 is removed by an etching process through a patterned photoresist layer to expose conductive layer 132. Alternatively, a portion of insulating layer 134 is removed by LDA using laser 286. The etching or LDA process also removes a portion of encapsulant 278 outside a footprint of semiconductor die 124 to a level below surface 288 of insulating layer 134.

In FIG. 10e, an insulating or passivation layer 290 is formed over encapsulant 278, insulating layer 134, and conductive layer 132 using PVD, CVD, printing, spin coating, spray coating, lamination, sintering or thermal oxidation. The insulating layer 290 contains one or more layers of SiO2, Si3N4, SiON, Ta2O5, Al2O3, or other material having similar insulating and structural properties. A portion of insulating layer 290 is removed by an etching process through a patterned photoresist layer to expose conductive layer 132.

An electrically conductive layer 292 is formed insulating layer 290 and conductive layer 132 using a patterning and metal deposition process such as printing, PVD, CVD, sputtering, electrolytic plating, and electroless plating. Conductive layer 292 can be one or more layers of Al, Cu, Sn, Ti, Ni, Au, Ag, or other suitable electrically conductive material. A portion of conductive layer 292 extends horizontally along insulating layer 290 and parallel to active surface 130 of semiconductor die 124 to laterally redistribute the electrical interconnect to conductive layer 132. Conductive layer 292 operates as a fan-out RDL for the electrical signals of semiconductor die 124. A portion of conductive layer 292 is electrically connected to conductive layer 132. Other portions of conductive layer 292 are electrically common or electrically isolated depending on the connectivity of semiconductor die 124.

Figure 10F:
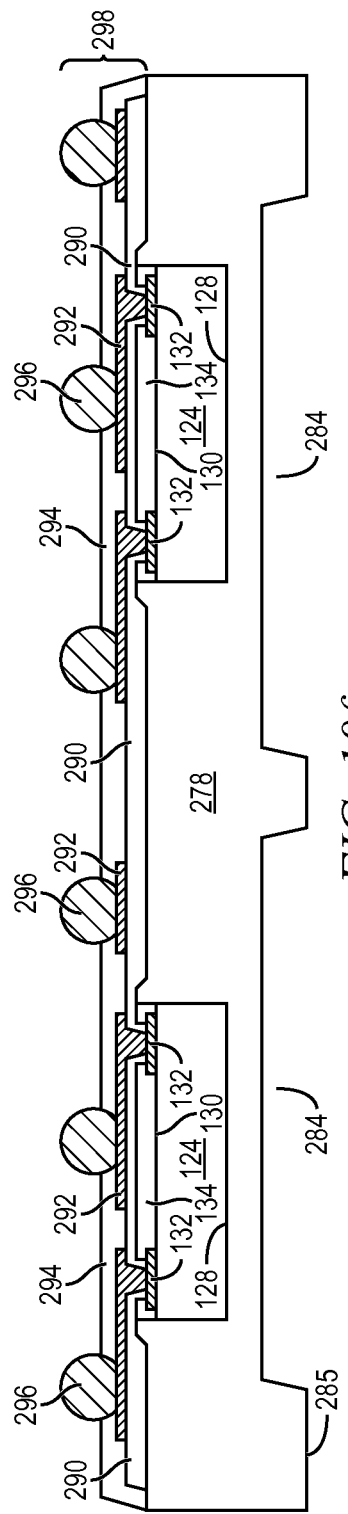

In FIG. 10f, an insulating or passivation layer 294 is formed over insulating layer 290 and conductive layer 292 using PVD, CVD, printing, spin coating, spray coating, screen printing or lamination. The insulating layer 294 can be one or more layers of SiO2, Si3N4, SiON, Ta2O5, Al2O3, or other material having similar insulating and structural properties. A portion of insulating layer 294 is removed by an etching process with a patterned photoresist layer to expose conductive layer 292.

An electrically conductive bump material is deposited over the exposed conductive layer 292 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 292 using a suitable attachment or bonding process. In one embodiment, the bump material is reflowed by heating the material above its melting point to form balls or bumps 296. In some applications, bumps 296 are reflowed a second time to improve electrical contact to conductive layer 292. Bumps 296 can also be compression bonded to conductive layer 292. Bumps 296 represent one type of interconnect structure that can be formed over conductive layer 292. The interconnect structure can also use stud bump, micro bump, or other electrical interconnect.

The combination of insulating layers 290 and 294, conductive layers 292, and bumps 296 constitute a build-up interconnect structure 298 formed over semiconductor die 124 and encapsulant 278. Additional insulating layers and RDLs can be formed in build-up interconnect structure 298 for interconnection to semiconductor die 124.

Figure 10G:
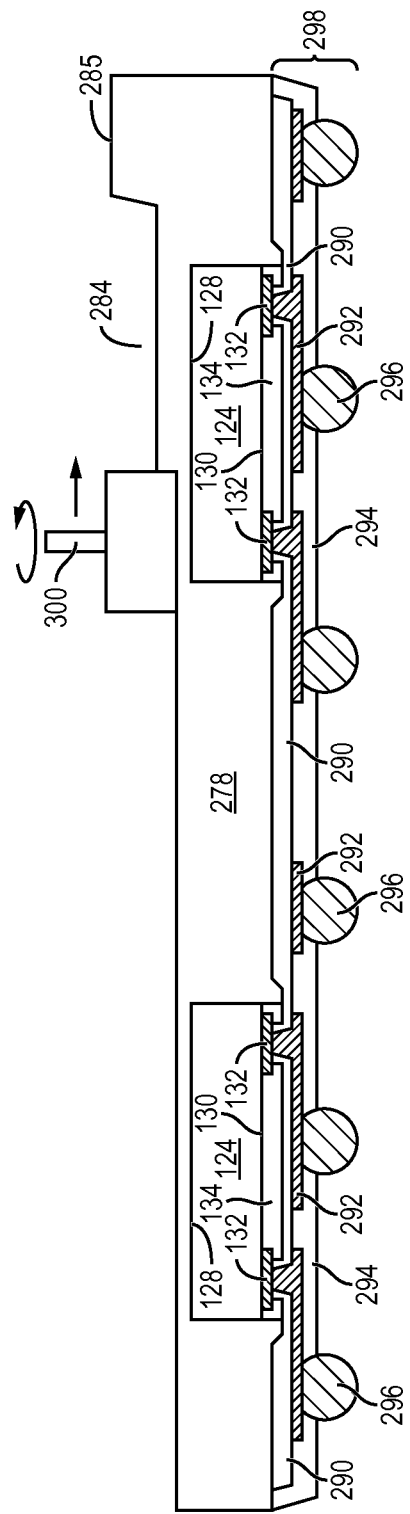
Figure 10H:
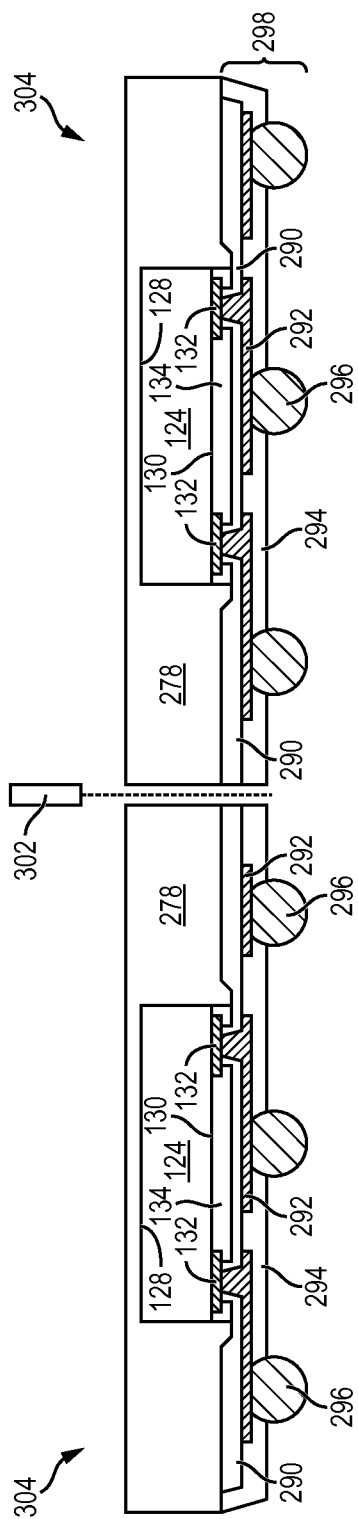

In FIG. 10g, a portion of encapsulant 278 is removed by grinder 300 to planarize the encapsulant and reduce the thickness of reconstituted semiconductor wafer 146. Recesses 284 are completely removed during planarization. Encapsulant 278 can also be planarized by an etching process or CMP. FIG. 10h shows reconstituted semiconductor wafer 146 having reduced thickness after the grinding operation. In one embodiment, encapsulant 278 remains covering back surface 128 of semiconductor die 124 with a thickness of 10 μm for environmental protection and laser marking. Alternatively, the grinding operation exposes back surface 128 of semiconductor die 124.

The reconstituted semiconductor wafer 146 is singulated through encapsulant 278 and build-up interconnect structure 298 with saw blade or laser cutting tool 302 into individual Fo-WLCSP 304.

Figure 11:
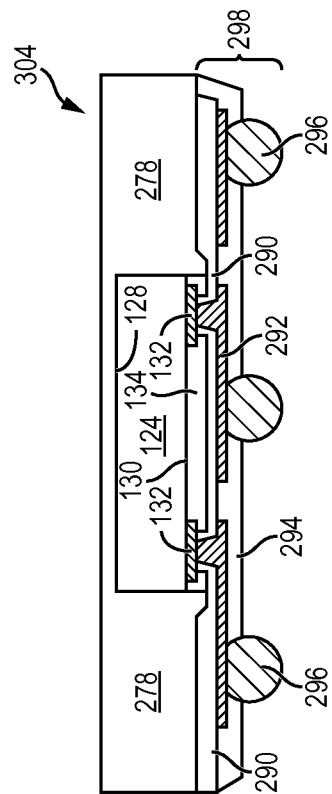
FIG. 11 illustrates the Fo-WLCSP formed from a thick encapsulant for stiffness with recesses in the encapsulant for stress relief according to FIGS. 10a-10h.

FIG. 11 shows Fo-WLCSP 304 after singulation. Conductive layer 132 of semiconductor die 124 is electrically connected to conductive layer 292 and bumps 296. Fo-WLCSP 304 is formed from reconstituted semiconductor wafer 146 with a thick encapsulant 278 formed over semiconductor die 124 and carrier 140 for structural support and stiffness during RDL and bump formation. Recesses 284 are formed in encapsulant 278 for stress relief and to reduce warpage of reconstituted semiconductor wafer 146. The combination of a thick encapsulant 278 with recesses 284 provides an effective balance between structural support and stiffness during RDL and bump formation as well as stress relief and reduced warpage of reconstituted semiconductor wafer 146. Encapsulant 278 undergoes back grinding to completely remove recesses 284 and reduce the thickness of Fo-WLCSP 304.

Figure 12D:
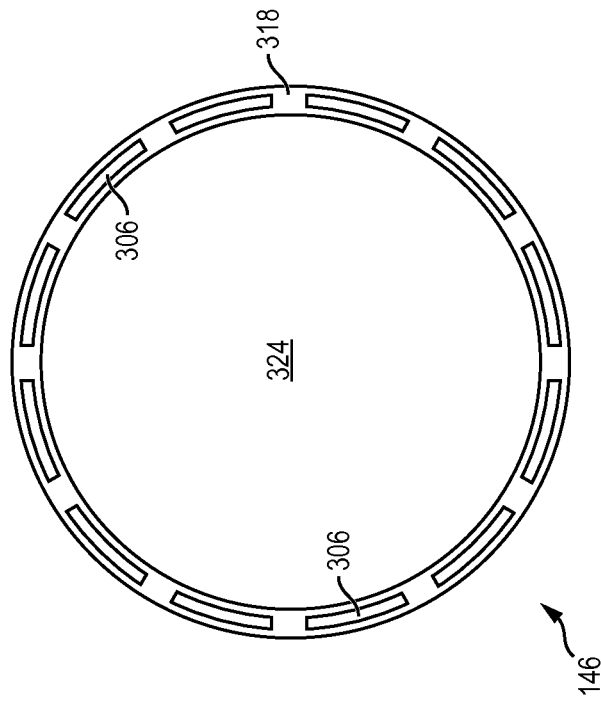

FIGS. 12a-12i illustrate, in relation to FIGS. 1 and 2a-2c, a process of forming a thick encapsulant and embedded support for stiffness with a recess in the encapsulant for stress relief in a Fo-WLCSP. Continuing from FIG. 4b, a stiffening support member 306 is mounted to or disposed over thermally releasable layer 144 over carrier 140. Stiffening support member 306 is a continuous ring or segmented ring around reconstituted semiconductor wafer 146. Stiffening support members 306 are also disposed internal to reconstituted semiconductor wafer 146 between semiconductor die 124. A molding compound or encapsulant 318 is dispensed with liquid or powder, tablet, and granular, or laminated with encapsulant sheet over reconstituted semiconductor wafer 146 and stiffening support members 306. Encapsulant 318 can be a polymer composite material, such as epoxy resin with filler, epoxy acrylate with filler, or polymer with proper filler. In FIG. 12a, reconstituted semiconductor wafer 146 with stiffening support members 306 covered by encapsulant 318 is placed into chase mold 310. Chase mold 310 includes a surface 316 extending from surface 317. Encapsulant 318 is evenly dispersed under an elevated temperature around semiconductor die 124, stiffening support members 306, and extended surfaces 316 using vacuum compression. In one embodiment, the molding temperature ranges from 80-150° C. with a molding time of 250-1000 seconds. The molding cure temperature ranges from 100-180° C. with a molding cure time of 20-120 minutes.

FIG. 12b shows reconstituted semiconductor wafer 146 covered by encapsulant 318 after removal from chase mold 310. In one embodiment, encapsulant 318 has a thickness D1=40-450 μm with respect to back surface 128 of semiconductor die 124. The thickness D1 of encapsulant 318 provides structure support and stiffness for reconstituted semiconductor wafer 146 during subsequent handling and RDL and bump formation.

Figure 12C:
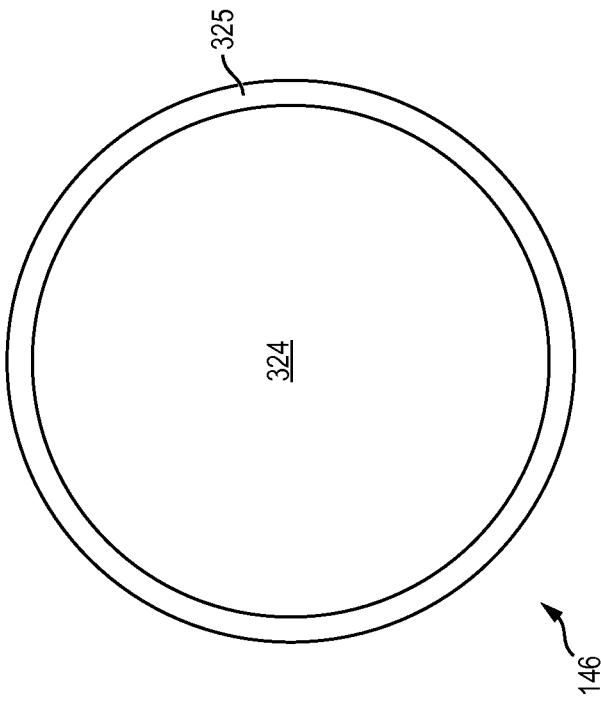

The extended surface 316 of chase mold 310 leaves a recess 324 from surface 325 into encapsulant 318. In one embodiment, the depth D2 of recess 324 is less than the depth D1 and the width W of recess 324 is less than half a width of semiconductor die 124. The ratio (D1−D2+die thickness)/die thickness ranges from 1.1 to 1.5. The depth D2 of recess 324 provides stress relief and reduced warpage for reconstituted semiconductor wafer 146 during subsequent RDL and bump formation. FIG. 12c shows a plan view of recess 324 in encapsulant 318 taken through line 12c-12c of FIG. 12b. FIG. 12d shows a plan view of recess 324 and segmented stiffening support members 306 in encapsulant 318. Encapsulant 318 can be circular or rectangular in plan view.

In FIG. 12e, carrier 140, carrier tape 142, and thermally releasable layer 144 are removed by chemical etching, mechanical peeling, CMP, mechanical grinding, thermal bake, UV light, laser scanning, or wet stripping to expose insulating layer 134 and encapsulant 318. A portion of insulating layer 134 is removed by an etching process through a patterned photoresist layer to expose conductive layer 132.

Alternatively, a portion of insulating layer 134 is removed by LDA using laser 326. The etching or LDA process also removes a portion of encapsulant 318 outside a footprint of semiconductor die 124 to a level below surface 327 of insulating layer 134. The reconstituted semiconductor wafer 146 is placed on chuck 328 for handling and structural support. Chuck 328 is partially disposed within recess 324.

In FIG. 12f, an insulating or passivation layer 330 is formed over encapsulant 318, insulating layer 134, and conductive layer 132 using PVD, CVD, printing, spin coating, spray coating, lamination, sintering or thermal oxidation. The insulating layer 330 contains one or more layers of SiO2, Si3N4, SiON, Ta2O5, Al2O3, or other material having similar insulating and structural properties. A portion of insulating layer 330 is removed by an etching process through a patterned photoresist layer to expose conductive layer 132.

An electrically conductive layer 332 is formed insulating layer 330 and conductive layer 132 using a patterning and metal deposition process such as printing, PVD, CVD, sputtering, electrolytic plating, and electroless plating. Conductive layer 332 can be one or more layers of Al, Cu, Sn, Ti, Ni, Au, Ag, or other suitable electrically conductive material. A portion of conductive layer 332 extends horizontally along insulating layer 330 and parallel to active surface 130 of semiconductor die 124 to laterally redistribute the electrical interconnect to conductive layer 132. Conductive layer 332 operates as a fan-out RDL for the electrical signals of semiconductor die 124. A portion of conductive layer 332 is electrically connected to conductive layer 132. Other portions of conductive layer 332 are electrically common or electrically isolated depending on the connectivity of semiconductor die 124.

Figure 12G:
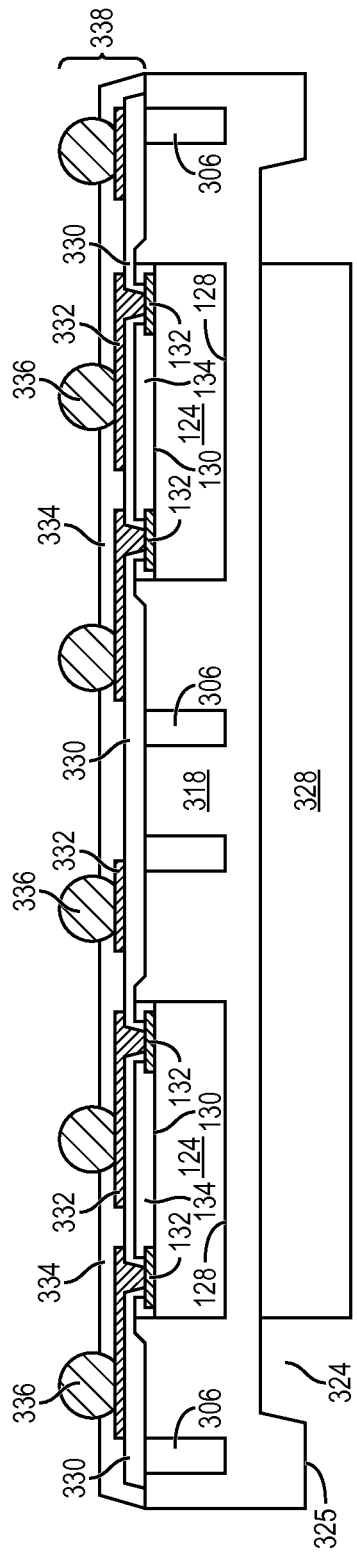

In FIG. 12g, an insulating or passivation layer 334 is formed over insulating layer 330 and conductive layer 332 using PVD, CVD, printing, spin coating, spray coating, screen printing or lamination. The insulating layer 334 can be one or more layers of SiO2, Si3N4, SiON, Ta2O5, Al2O3, or other material having similar insulating and structural properties. A portion of insulating layer 334 is removed by an etching process with a patterned photoresist layer to expose conductive layer 332.

An electrically conductive bump material is deposited over the exposed conductive layer 332 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 332 using a suitable attachment or bonding process. In one embodiment, the bump material is reflowed by heating the material above its melting point to form balls or bumps 336. In some applications, bumps 336 are reflowed a second time to improve electrical contact to conductive layer 332. Bumps 336 can also be compression bonded to conductive layer 332. Bumps 336 represent one type of interconnect structure that can be formed over conductive layer 332. The interconnect structure can also use stud bump, micro bump, or other electrical interconnect.

The combination of insulating layers 330 and 334, conductive layers 332, and bumps 336 constitute a build-up interconnect structure 338 formed over semiconductor die 124 and encapsulant 318. Additional insulating layers and RDLs can be formed in build-up interconnect structure 338 for interconnection to semiconductor die 124.

Figure 12H:
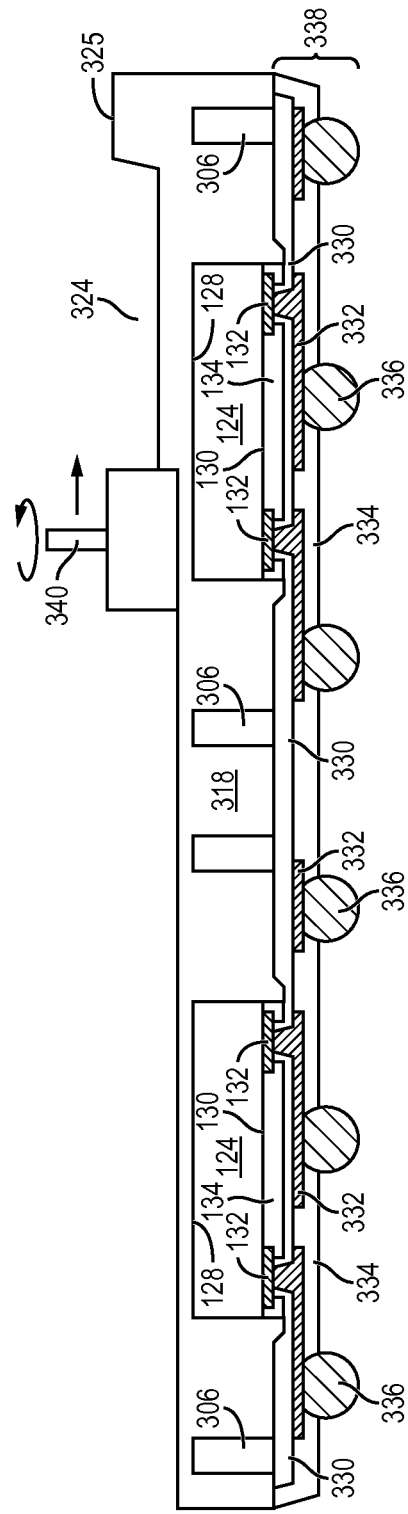
Figure 12I:
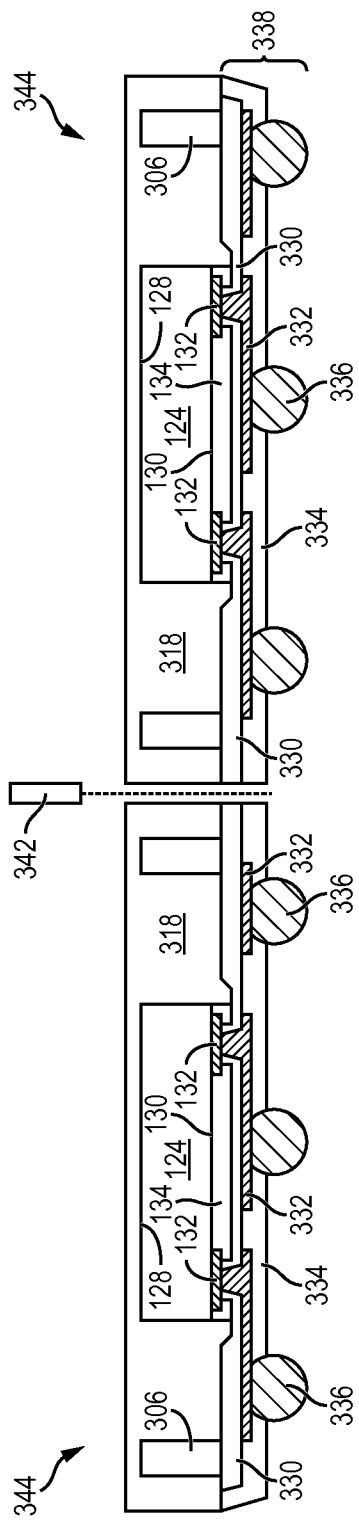

In FIG. 12h, chuck 328 is removed and a portion of encapsulant 318 is removed by grinder 340 to planarize the encapsulant and reduce the thickness of reconstituted semiconductor wafer 146. Recess 324 is completely removed during planarization. Encapsulant 318 can also be planarized by an etching process or CMP. FIG. 12i shows reconstituted semiconductor wafer 146 having reduced thickness after the grinding operation. In one embodiment, encapsulant 318 remains covering back surface 128 of semiconductor die 124 with a thickness of 10 μm for environmental protection and laser marking. Alternatively, the grinding operation exposes back surface 128 of semiconductor die 124.

The reconstituted semiconductor wafer 146 is singulated through encapsulant 318 and build-up interconnect structure 338 with saw blade or laser cutting tool 342 into individual Fo-WLCSP 344.

Figure 13:
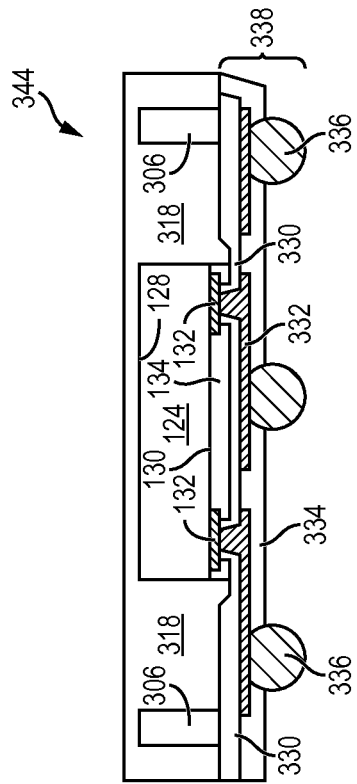
FIG. 13 illustrates the Fo-WLCSP formed from a thick encapsulant and embedded support for stiffness with a recess in the encapsulant for stress relief according to FIGS. 12a-12i.

FIG. 13 shows Fo-WLCSP 344 after singulation. Conductive layer 132 of semiconductor die 124 is electrically connected to conductive layer 332 and bumps 336. Fo-WLCSP 344 is formed from reconstituted semiconductor wafer 146 with a thick encapsulant 318 formed over semiconductor die 124 and carrier 140 for structural support and stiffness during RDL and bump formation. Recess 324 is formed in encapsulant 318 for stress relief and to reduce warpage of reconstituted semiconductor wafer 146. The combination of a thick encapsulant 318 with recess 324 provides an effective balance between structural support and stiffness during RDL and bump formation as well as stress relief and reduced warpage of reconstituted semiconductor wafer 146. Encapsulant 318 undergoes back grinding to completely remove recess 324 and reduce the thickness of Fo-WLCSP 344.

Figure 14A:
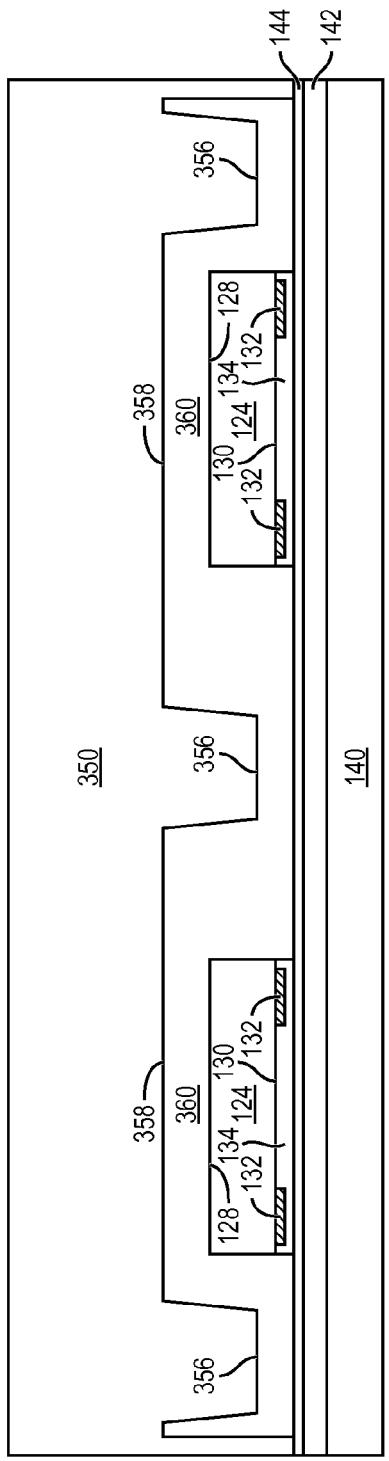

FIGS. 14a-14i illustrate, in relation to FIGS. 1 and 2a-2c, a process of forming a dual layer encapsulant for stiffness and stress relief in a Fo-WLCSP. Continuing from FIG. 4b, a molding compound or encapsulant 360 is dispensed with liquid or powder, tablet, and granular, or laminated with encapsulant sheet over reconstituted semiconductor wafer 146. Encapsulant 360 can be a polymer composite material, such as epoxy resin with filler, epoxy acrylate with filler, or polymer with proper filler. In FIG. 14a, reconstituted semiconductor wafer 146 with encapsulant 360 is placed into chase mold 350. Chase mold 350 includes protrusions or surfaces 356 extending from surface 358. Encapsulant 360 is evenly dispersed under an elevated temperature around semiconductor die 124 and extended surfaces 356 using vacuum compression. In one embodiment, the molding temperature ranges from 80-150° C. with a molding time of 250-1000 seconds. The molding cure temperature ranges from 100-180° C. with a molding cure time of 20-120 minutes.

Figure 14B:
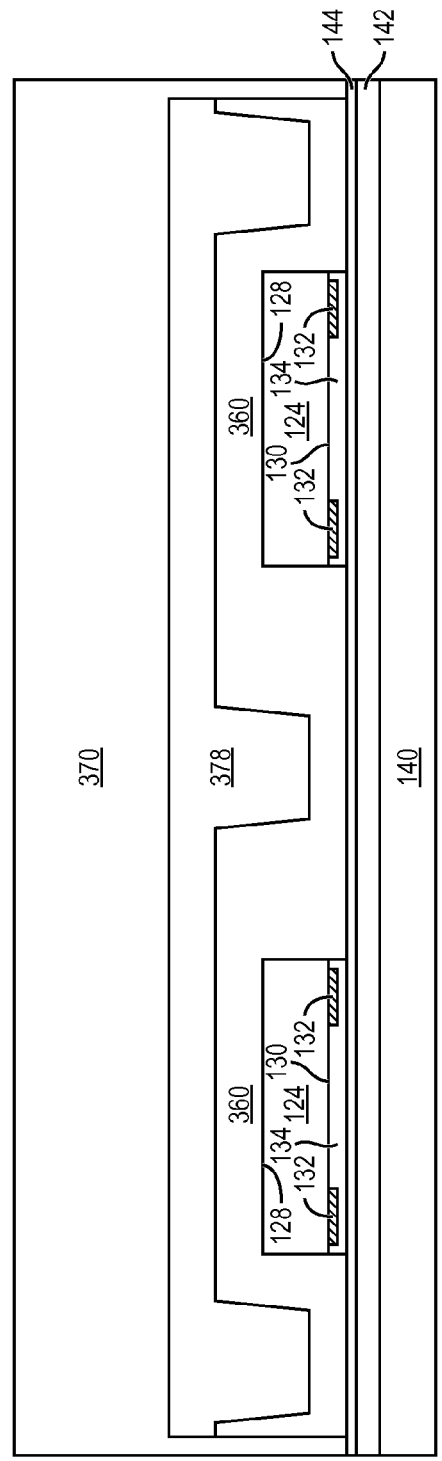

Reconstituted semiconductor wafer 146 covered by encapsulant 360 is removed from chase mold 350. The extended surfaces 356 of chase mold 350 leave recesses from surface 366 into encapsulant 360. A molding compound or encapsulant 378 is dispensed with liquid or powder, tablet, and granular, or laminated with encapsulant sheet over encapsulant 360 and into the recesses. Encapsulant 378 can be a polymer composite material, such as epoxy resin with filler, epoxy acrylate with filler, or polymer with proper filler. In FIG. 14b, reconstituted semiconductor wafer 146 with encapsulant 378 is placed into chase mold 370. Encapsulant 378 is evenly dispersed under an elevated temperature over encapsulant 360 using vacuum compression. In one embodiment, the molding temperature ranges from 80-150° C. with a molding time of 250-1000 seconds. The molding cure temperature ranges from 100-180° C. with a molding cure time of 20-120 minutes.

FIG. 14c shows reconstituted semiconductor wafer 146 with encapsulant 378 disposed over encapsulant 360 after removal from chase mold 370. In one embodiment, the CTE of encapsulant 360 is made high, e.g. 6-12 ppm/K with a higher filler concentration, while the CTE of encapsulant 378 is made low, e.g. greater than 1.5×CTE of encapsulant 360 with a lower filler concentration. Alternatively, the CTE of encapsulant 378 is made high, e.g. 6-12 ppm/K with a higher filler concentration, while the CTE of encapsulant 360 is made low, e.g. greater than 1.5×CTE of encapsulant 378 with a lower filler concentration.

FIG. 14d shows a plan view of reconstituted semiconductor wafer 146 with encapsulant 378 disposed over encapsulant 360 taken along line 14d-14d of FIG. 14c. Encapsulant 360 can be circular or rectangular in plan view.

Figure 14E:
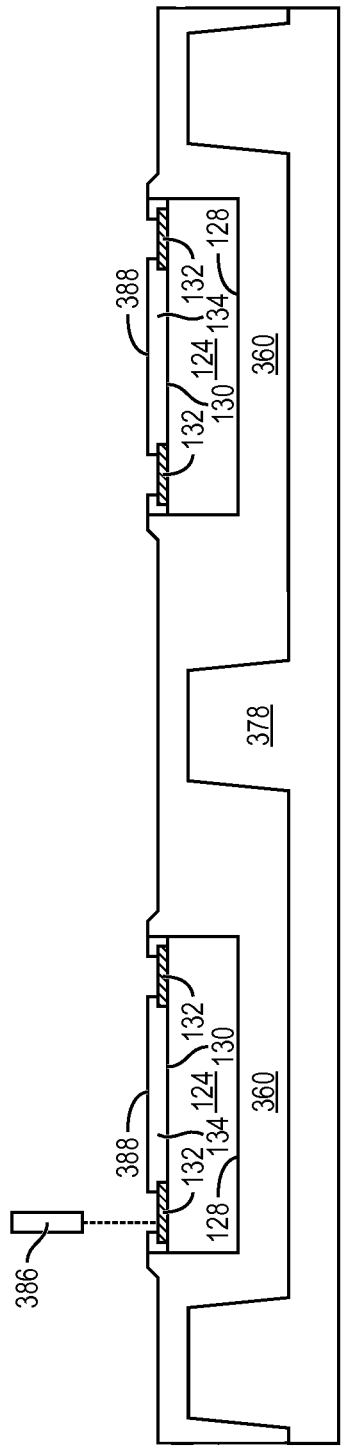

In FIG. 14e, carrier 140, carrier tape 142, and thermally releasable layer 144 are removed by chemical etching, mechanical peeling, CMP, mechanical grinding, thermal bake, UV light, laser scanning, or wet stripping to expose insulating layer 134 and encapsulant 360. A portion of insulating layer 134 is removed by an etching process through a patterned photoresist layer to expose conductive layer 132. Alternatively, a portion of insulating layer 134 is removed by LDA using laser 386. The etching or LDA process also removes a portion of encapsulant 360 outside a footprint of semiconductor die 124 to a level below surface 388 of insulating layer 134.

Figure 14F:
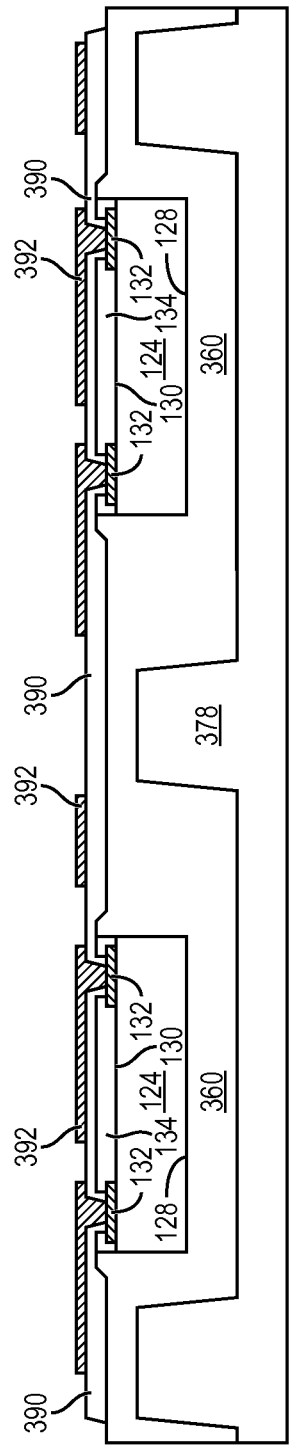

In FIG. 14f, an insulating or passivation layer 390 is formed over encapsulant 360, insulating layer 134, and conductive layer 132 using PVD, CVD, printing, spin coating, spray coating, lamination, sintering or thermal oxidation. The insulating layer 390 contains one or more layers of SiO2, Si3N4, SiON, Ta2O5, Al2O3, or other material having similar insulating and structural properties. A portion of insulating layer 390 is removed by an etching process through a patterned photoresist layer to expose conductive layer 132.

An electrically conductive layer 392 is formed insulating layer 390 and conductive layer 132 using a patterning and metal deposition process such as printing, PVD, CVD, sputtering, electrolytic plating, and electroless plating. Conductive layer 392 can be one or more layers of Al, Cu, Sn, Ti, Ni, Au, Ag, or other suitable electrically conductive material. A portion of conductive layer 392 extends horizontally along insulating layer 390 and parallel to active surface 130 of semiconductor die 124 to laterally redistribute the electrical interconnect to conductive layer 132. Conductive layer 392 operates as a fan-out RDL for the electrical signals of semiconductor die 124. A portion of conductive layer 392 is electrically connected to conductive layer 132. Other portions of conductive layer 392 are electrically common or electrically isolated depending on the connectivity of semiconductor die 124.

In FIG. 14g, an insulating or passivation layer 394 is formed over insulating layer 390 and conductive layer 392 using PVD, CVD, printing, spin coating, spray coating, screen printing or lamination. The insulating layer 394 can be one or more layers of SiO2, Si3N4, SiON, Ta2O5, Al2O3, or other material having similar insulating and structural properties. A portion of insulating layer 394 is removed by an etching process with a patterned photoresist layer to expose conductive layer 392.

An electrically conductive bump material is deposited over the exposed conductive layer 392 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 392 using a suitable attachment or bonding process. In one embodiment, the bump material is reflowed by heating the material above its melting point to form balls or bumps 396. In some applications, bumps 396 are reflowed a second time to improve electrical contact to conductive layer 392. Bumps 396 can also be compression bonded to conductive layer 392. Bumps 396 represent one type of interconnect structure that can be formed over conductive layer 392. The interconnect structure can also use stud bump, micro bump, or other electrical interconnect.

The combination of insulating layers 390 and 394, conductive layers 392, and bumps 396 constitute a build-up interconnect structure 398 formed over semiconductor die 124 and encapsulant 360. Additional insulating layers and RDLs can be formed in build-up interconnect structure 398 for interconnection to semiconductor die 124.

Figure 14I:
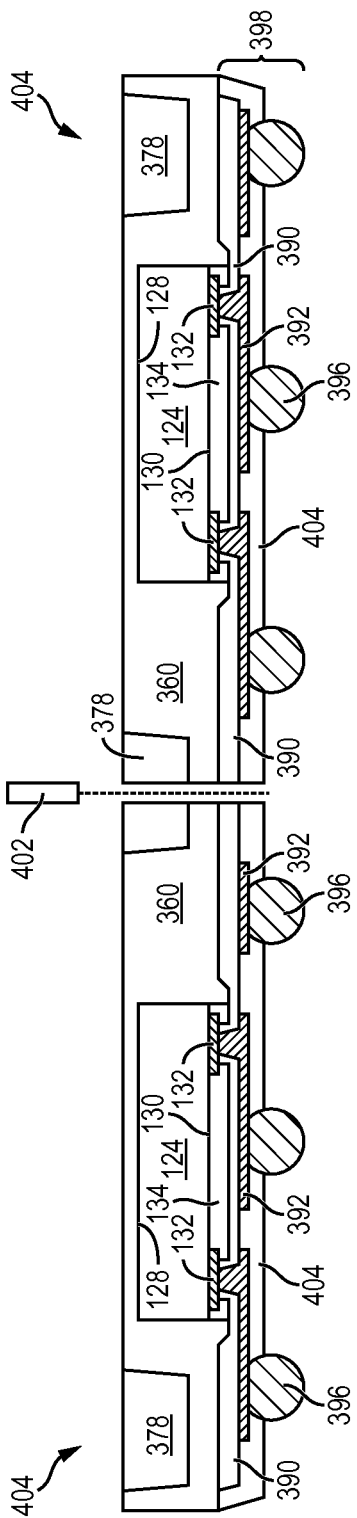

In FIG. 14h, a portion of encapsulant 360 and encapsulant 378 are removed by grinder 400 to planarize the encapsulants and reduce the thickness of reconstituted semiconductor wafer 146. Encapsulant 360 and encapsulant 378 can also be planarized by an etching process or CMP. FIG. 14i shows reconstituted semiconductor wafer 146 having reduced thickness after the grinding operation. In one embodiment, encapsulant 360 remains covering back surface 128 of semiconductor die 124 with a thickness of 10 μm for environmental protection and laser marking. Alternatively, the grinding operation exposes back surface 128 of semiconductor die 124.

The reconstituted semiconductor wafer 146 is singulated through encapsulant 360 and build-up interconnect structure 398 with saw blade or laser cutting tool 402 into individual Fo-WLCSP 404.

Figure 15:
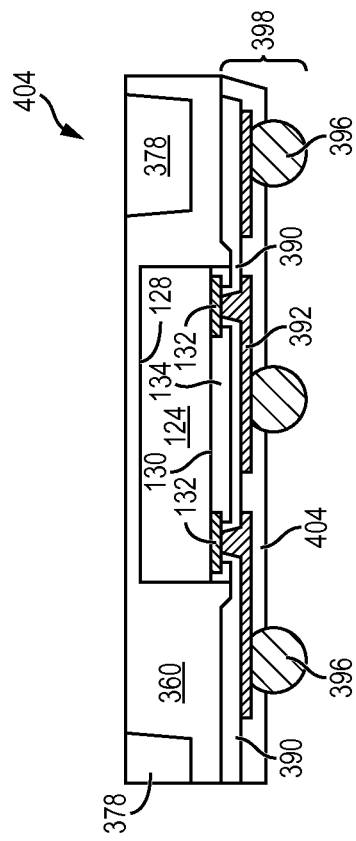
FIG. 15 illustrates the Fo-WLCSP formed from a dual layer encapsulant for stiffness and stress relief according to FIGS. 14a-14i.

FIG. 15 shows Fo-WLCSP 404 after singulation. Conductive layer 132 of semiconductor die 124 is electrically connected to conductive layer 392 and bumps 396. Fo-WLCSP 404 is formed from reconstituted semiconductor wafer 146 with a thick encapsulant 360 formed over semiconductor die 124 and carrier 140 for structural support and stiffness during RDL and bump formation. Recesses 364 are formed in encapsulant 360 and filled with encapsulant 378 for stress relief and to reduce warpage of reconstituted semiconductor wafer 146. The combination of a thick encapsulant 360 with recesses 364 filled with encapsulant 378 provides an effective balance between structural support and stiffness during RDL and bump formation as well as stress relief and reduced warpage of reconstituted semiconductor wafer 146. Encapsulant 360 and encapsulant 378 undergo back grinding to reduce the thickness of Fo-WLCSP 404.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
  providing a first semiconductor die;
  molding an encapsulant over the semiconductor die to include a recess molded in the encapsulant;
  forming an interconnect structure over the semiconductor die; and
  reducing a thickness of the encapsulant to remove the recess.

2. The method of claim 1, further including:
  disposing a support structure within the recess prior to forming the interconnect structure; and
  removing the support structure after forming the interconnect structure.

3. The method of claim 1, further including:
  providing a second semiconductor die adjacent to the first semiconductor die; and
  forming the recess over the first semiconductor die and outside a footprint of the second semiconductor die.

4. The method of claim 1, further including:
  providing a second semiconductor die; and
  forming the recess over the first semiconductor die and second semiconductor die.

5. The method of claim 1, further including disposing a support member around the first semiconductor die prior to molding the encapsulant.

6. A method of making a semiconductor device, comprising:
  providing a first semiconductor die;
  depositing a first encapsulant over the first semiconductor die including a first recess formed in the first encapsulant; and
  removing a portion of the first encapsulant to reduce a thickness of the first encapsulant.

7. The method of claim 6, further including:
  forming a second recess in the first encapsulant over the first semiconductor die; and
  removing the portion of the first encapsulant to remove the first and second recesses.

8. The method of claim 6, further including providing a second semiconductor die, wherein the first recess extends over the first semiconductor die and second semiconductor die.

9. The method of claim 6, further including:
  providing a second semiconductor die; and
  forming a second recess in the first encapsulant over the second semiconductor die.

10. The method of claim 9, further including removing the portion of the first encapsulant to remove the first and second recesses.

11. The method of claim 6, further including depositing a second encapsulant over the first encapsulant and within the first recess.

12. The method of claim 11, wherein removing the portion of the first encapsulant includes leaving a portion of the second encapsulant remaining in the recess.

13. A semiconductor device, comprising: a first semiconductor die; a first encapsulant deposited over the first semiconductor die and including a first recess in the first encapsulant with the first recess disposed within a footprint of the first semiconductor die;
  an interconnect structure formed over the first semiconductor die;
  and
  a support member disposed in the encapsulant around the first semiconductor die.

14. The semiconductor device of claim 13, wherein the first recess is outside the footprint of the first semiconductor die.

15. The semiconductor device of claim 13, further including a second recess disposed over the first semiconductor die.

16. The semiconductor device of claim 13, further including a second semiconductor die, wherein the encapsulant includes a second recess deposited over the second semiconductor die.

17. The semiconductor device of claim 13, further including a second encapsulant deposited within the first recess.

18. A semiconductor device, comprising:
a first semiconductor die;
a first encapsulant including a first recess deposited within and extending outside a footprint of the first semiconductor die; and
a second encapsulant deposited in the first recess.

19. The semiconductor device of claim 18, further including a second semiconductor die, wherein the first encapsulant is deposited over the second semiconductor die.

20. The semiconductor device of claim 19, wherein the first recess is disposed over the first semiconductor die and second semiconductor die.

21. The semiconductor device of claim 19, wherein the encapsulant further includes a second recess disposed over the second semiconductor die.

22. The semiconductor device of claim 18, further including a support member disposed adjacent to the first semiconductor die.

23. The semiconductor device of claim 18, wherein the first semiconductor die is singulated through the first encapsulant and second encapsulant.

24. The method of claim 1, further including depositing a second encapsulant in the recess.

* * * * *